(12) United States Patent
Lin et al.

(10) Patent No.: US 12,466,833 B2
(45) Date of Patent: Nov. 11, 2025

(54) ORGANIC COMPOUND, P-TYPE DOPED MATERIAL AND APPLICATION THEREOF

(71) Applicant: Shanghai Tianma Microelectronics Co., Ltd., Shanghai (CN)

(72) Inventors: Yafei Lin, Shanghai (CN); Jinghua Niu, Shanghai (CN); Feng Yu, Shanghai (CN)

(73) Assignee: Shanghai Tianma Microelectronics Co., Ltd., Shanghai (CN)

( * ) Notice: Subject to any disclaimer, the term of this patent is extended or adjusted under 35 U.S.C. 154(b) by 741 days.

(21) Appl. No.: 17/902,235

(22) Filed: Sep. 2, 2022

(65) Prior Publication Data
US 2023/0022289 A1  Jan. 26, 2023

(30) Foreign Application Priority Data
Apr. 26, 2022  (CN) .......................... 202210451629.2

(51) Int. Cl.
*C07D 487/14* (2006.01)
*H10K 50/17* (2023.01)
*H10K 71/30* (2023.01)
*H10K 85/60* (2023.01)

(52) U.S. Cl.
CPC .......... *C07D 487/14* (2013.01); *H10K 50/17* (2023.02); *H10K 71/30* (2023.02); *H10K 85/652* (2023.02); *H10K 85/654* (2023.02); *H10K 85/6572* (2023.02)

(58) Field of Classification Search
CPC .............. C07D 487/14; H10K 85/654; H10K 85/6572; C07F 7/0812; C09K 2211/1029; C09K 2211/1044; C09K 2211/1059; C09K 2211/1074
See application file for complete search history.

(56) References Cited

U.S. PATENT DOCUMENTS

2022/0093877 A1\* 3/2022 Lin ...................... H10K 85/654

FOREIGN PATENT DOCUMENTS

CN  113461693 A  10/2021

\* cited by examiner

*Primary Examiner* — Jenna N Chandhok
(74) *Attorney, Agent, or Firm* — KDW FIRM PLLC

(57) ABSTRACT

Provided are an organic compound, a P-type doped material and an application thereof. The organic compound has a structure represented by Formula I, and through a molecular structure design, the organic compound has a lowest unoccupied molecular orbital energy level which is close to an anode work function and a highest occupied molecular orbital energy level of a hole transport layer, effectively promoting the generation of holes. The organic compound has a suitable molecular weight, low volatility and high stability, sufficiently satisfying an evaporation preparation process of OLED devices; moreover, the synthesis method is simple and low cost, achieving large-scale application. As an organic electroluminescent material, the organic compound can be used as the P-type doped material, especially suitable for a charge injection layer of organic electroluminescent devices, which can adjust charge balance of devices, effectively improve efficiency and lifetime of devices and reduce drive voltage and energy consumption.

17 Claims, 1 Drawing Sheet

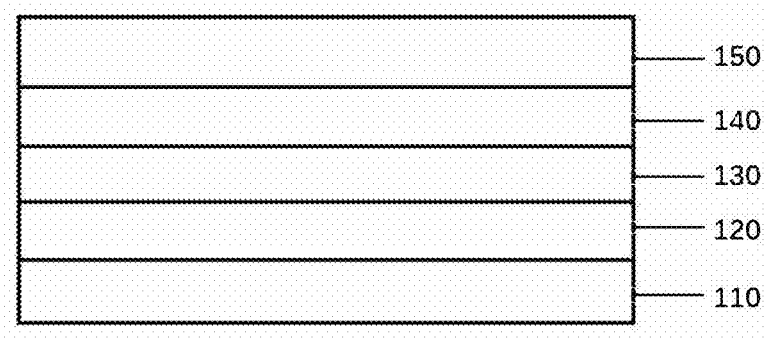

ORGANIC COMPOUND, P-TYPE DOPED MATERIAL AND APPLICATION THEREOF

CROSS-REFERENCE TO RELATED APPLICATION(S)

This application claims priority to Chinese Patent Application No. 202210451629.2 filed Apr. 26, 2022, the disclosure of which is incorporated herein by reference in its entirety.

TECHNICAL FIELD

The present disclosure belongs to the technical field of organic electroluminescent materials and, in particular, to an organic compound, a P-type doped material and an application thereof.

BACKGROUND

Since the advent of organic light-emitting diodes (OLEDs) and solar cells in 1989, the OLEDs have attracted extensive attention from scientific researchers and researchers in enterprises because of the advantages of self-luminescence, low power consumption, high contrast, wide color gamut and application to folding. OLED technology has gained rapid development and commercial success. In recent years, as a new generation of display technology, the OLEDs have been widely applied to flat panel display, flexible display, solid-state lighting and in-vehicle display.

An OLED light-emitting device is a laminated device composed of multiple layers of organic film layers and generally includes a cathode, an anode and multiple layers of organic film layers disposed between two electrodes. An organic film layer is a core part of the OLED device and includes a light-emitting layer and functional layers assisting in transporting such as an electron transport layer, a hole transport layer, a hole injection layer, an electron injection layer, a hole blocking layer and an electron blocking layer. A material of the organic film layer is very important, which directly affects device performance.

In an existing OLED device, since the organic film layer has relatively low carrier mobility, a drive voltage of the device is directly affected, and a thermal load of the light-emitting device is also affected, thereby affecting a brightness decay lifetime of the light-emitting device. To improve luminescence performance of the OLED device, the hole transport layer is doped with a suitable electron acceptor material (P-type doping) or/and the electron transport layer is doped with an electron donor material (N-type doping) so that a carrier density of the light-emitting device can be significantly improved and the carrier mobility can be improved.

A P-type dopant is a material that contributes to the injection of holes from the anode into the hole transport layer. At present, various types of P-type dopant have been developed and utilized. Commonly used P-type dopants are F4-TCNQ

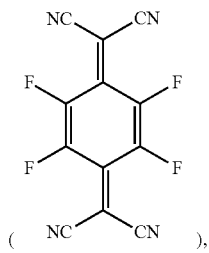

HATCN

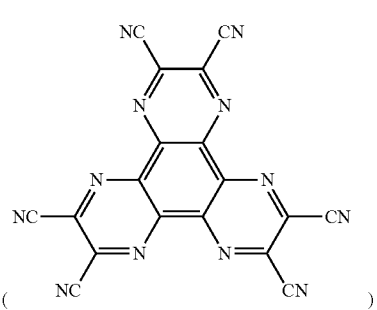

and the like. However, these materials generally have the disadvantages such as low evaporation temperature and relatively high volatility, which can not only contaminate an evaporation cavity during device preparation, but also cannot effectively reduce the voltage of the organic light-emitting device, resulting in high energy consumption and poor performance of the device, and the device has no widely commercialized application. A newly developed P-type doped material can solve the problem of stability to a certain extent. However, the material has a complex structure and a high cost in preparation and use, which imposes a great economic pressure on practical use.

Therefore, to improve the performance of the OLED device, obtain a lower drive voltage and a longer brightness decay lifetime, it is crucial to develop more types of P-type doped material with good performance and low costs.

SUMMARY

To develop more types of P-type doped material with good performance and low costs, a first aspect of the present disclosure is to provide an organic compound having a structure represented by Formula I:

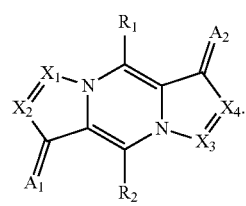

Formula I

In Formula I, $X_1$, $X_2$, $X_3$ and $X_4$ are each independently selected from N or CR; and R, $R_1$ and $R_2$ are each independently selected from any one of hydrogen, halogen, cyano, isocyano, substituted or unsubstituted C1-C20 linear or branched alkyl, substituted or unsubstituted C1-C20 alkoxy, substituted or unsubstituted C3-C20 cycloalkyl, substituted or unsubstituted C6-C30 aryl, substituted or unsubstituted C2-C30 heteroaryl, C6-C30 ketoaryl, C4-C30 ketoheteroaryl, C6-C30 aryl sulfonyl, C6-C30 aryl phosphoroso, C3-C20 alkylsilyl, C6-C30 arylsilyl, a phosphino group, an acyl group, a carboxyl group, an ester group, a sulfonyl group or a sulfinyl group.

In Formula I, $A_1$ and $A_2$ are each independently selected from 0, NR' or CR"R"';

wherein, R', R" and R'" are electron withdrawing groups and each independently selected from any one of halogen, cyano, isocyano, $R_{11}$-substituted C1-C20 linear or branched alkyl, $R_{11}$-substituted C1-C20 alkoxy, $R_{12}$-substituted C6-C30 aryl, substituted or unsubstituted C3-C30 heteroaryl, substituted or unsubstituted C6-C30 ketoaryl, substituted or unsubstituted C4-C30 ketoheteroaryl, substituted or unsubstituted C6-C30 aryl sulfonyl, substituted or unsubstituted C6-C30 aryl phosphoroso, an ester group, an acyl group, a carboxyl group, a phosphino group, a sulfo group, a sulfonyl group or a sulfinyl group;

$R_{11}$ is each independently selected from at least one of halogen, cyano, isocyano or a sulfo group; and $R_{12}$ is each independently selected from at least one of halogen, cyano, isocyano, a sulfo group, halogenated C1-C20 linear or branched alkyl, or halogenated C1-C20 alkoxy.

In the organic compound provided by the present disclosure, through a design of a structure of a parent core and the cooperation of the parent core with a particular group, the organic compound has a lowest unoccupied molecular orbital energy level (LUMO energy level) which is close to an anode work function and a highest occupied molecular orbital energy level (HOMO energy level) of the hole transport layer, effectively promoting the generation of holes. The organic compound has a suitable molecular weight, low volatility and high thermal stability, sufficiently satisfying an evaporation preparation process of an OLED device. As an organic electroluminescent material, the organic compound is particularly applicable to a P-type doped material. The organic compound can effectively improve efficiency and a lifetime of the device and reduce a drive voltage and energy consumption.

In the present disclosure, halogen may be F, Cl, Br or I.

In the present disclosure, C1-C20 may be C1, C2, C3, C4, C5, C6, C8, C9, C10, C12, C13, C14, C15, C16, C18 or the like.

In the present disclosure, C3-C20 may be C3, C4, C5, C6, C8, C9, C10, C12, C13, C14, C15, C16, C18 or the like.

In the present disclosure, C6-C30 may be C6, C8, C9, C10, C12, C13, C14, C15, C16, C18, C20, C22, C24, C26, C28 or the like.

In the present disclosure, C2-C30 may be C2, C3, C4, C5, C6, C8, C9, C10, C12, C13, C14, C15, C16, C18, C20, C22, C24, C26, C28 or the like.

In the present disclosure, C4-C30 may be C4, C5, C6, C8, C9, C10, C12, C13, C14, C15, C16, C18, C20, C22, C24, C26, C28 or the like.

In the present disclosure, C3-C30 may be C3, C4, C5, C6, C8, C9, C10, C12, C13, C14, C15, C16, C18, C20, C22, C24, C26, C28 or the like.

A second aspect of the present disclosure is to provide a P-type doped material. The P-type doped material includes at least one of the organic compounds each according to the first aspect.

A third aspect of the present disclosure is to provide an organic light-emitting display panel. The organic light-emitting display panel includes an anode, a cathode and an organic layer disposed between the anode and the cathode, wherein a material of the organic layer includes the P-type doped material according to the second aspect.

A fourth aspect of the present disclosure is to provide a display device. The display device includes the organic light-emitting display panel according to the third aspect.

BRIEF DESCRIPTION OF DRAWINGS

The Figure is a structure diagram of an organic electroluminescent device according to an embodiment of the present disclosure.

REFERENCE LIST

110 anode
120 first organic functional layer
130 light-emitting layer
140 second organic functional layer
150 cathode

DETAILED DESCRIPTION

Technical solutions of the present disclosure are further described below through the detailed description. Those skilled in the art are to understand that the embodiments are merely used for understanding the present disclosure and are not to be construed as specific limitations to the present disclosure.

In an embodiment, the present disclosure provides an organic compound having a structure represented by Formula I:

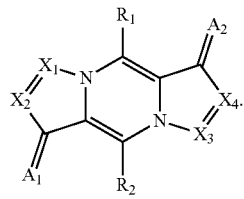

Formula I

In Formula I, $X_1$, $X_2$, $X_3$ and $X_4$ are each independently selected from N or CR;

R, $R_1$ and $R_2$ are each independently selected from any one of hydrogen, halogen, cyano, isocyano, substituted or unsubstituted C1-C20 linear or branched alkyl, substituted or unsubstituted C1-C20 alkoxy, substituted or unsubstituted C3-C20 cycloalkyl, substituted or unsubstituted C6-C30 aryl, substituted or unsubstituted C2-C30 heteroaryl, C6-C30 ketoaryl, C4-C30 ketoheteroaryl, C6-C30 aryl sulfonyl, C6-C30 aryl phosphoroso, C3-C20 alkylsilyl, C6-C30 arylsilyl, a phosphino group, an acyl group, a carboxyl group, an ester group, a sulfonyl group or a sulfinyl group.

In Formula I, $A_1$ and $A_2$ are each independently selected from 0, NR' or CR"R"';

wherein, R', R" and R'" are electron withdrawing groups and each independently selected from any one of halogen, cyano, isocyano, $R_{11}$-substituted C1-C20 linear or branched alkyl, $R_{11}$-substituted C1-C20 alkoxy, $R_{12}$-substituted C6-C30 aryl, substituted or unsubstituted C3-C30 heteroaryl, substituted or unsubstituted C6-C30 ketoaryl, substituted or unsubstituted C4-C30 ketoheteroaryl, substituted or unsubstituted C6-C30 aryl sulfonyl, substituted or unsubstituted C6-C30 aryl phosphoroso, an ester group, an acyl group, a carboxyl group, a phosphino group, a sulfo group, a sulfonyl group or a sulfinyl group;

$R_{11}$ is each independently selected from at least one of halogen, cyano, isocyano or a sulfo group; and $R_{12}$ is each independently selected from at least one of halogen, cyano, isocyano, a sulfo group, halogenated C1-C20 linear or branched alkyl or halogenated C1-C20 alkoxy.

The organic compound provided by the present disclosure has the structure represented by Formula I, where an aza-fused ring is used as a structure of a parent core, and groups $A_1$ and $A_2$ having substituents $R_1$ and $R_2$ and an electron withdrawing property are introduced at particular sites of the structure of the parent core. Through a design of the structure of the parent core and the compounding of the parent core with the particular groups, the organic compound has a lowest unoccupied molecular orbital energy level (LUMO energy level) which is close to an anode work function and a highest occupied molecular orbital energy level (HOMO energy level) of a hole transport layer, effectively promoting the generation of holes. The organic compound has a suitable molecular weight (the molecular weight is 200 to 1000), low volatility, high stability and a suitable evaporation temperature, sufficiently satisfying an evaporation preparation process of an OLED device. As a P-type doped material, the organic compound is applicable to a charge injection layer (hole injection layer) of the OLED device. The organic compound can effectively improve luminescence efficiency and a lifetime of the device and reduce a drive voltage so that the device has more excellent overall performance.

In the present disclosure, the expression of Ca-Cb means that the number of carbon atoms in a group is a to b. Unless otherwise specified, the number of carbon atoms does not include the number of carbon atoms in a substituent.

In the present disclosure, the description of a chemical element contains a concept of isotopes with the same chemical property. For example, hydrogen (H) includes $^1H$ (protium), $^2H$ (deuterium, D), $^3H$ (tritium, T) and the like, and carbon (C) includes $^{12}C$, $^{13}C$ and the like.

In the present disclosure, halogen may be F, Cl, Br or I.

In the present disclosure, C1-C20 may be C1, C2, C3, C4, C5, C6, C8, C9, C10, C12, C13, C14, C15, C16, C18 or the like.

In the present disclosure, C3-C20 may be C3, C4, C5, C6, C8, C9, C10, C12, C13, C14, C15, C16, C18 or the like.

In the present disclosure, C6-C30 may be C6, C8, C9, C10, C12, C13, C14, C15, C16, C18, C20, C22, C24, C26, C28 or the like.

In the present disclosure, C2-C30 may be C2, C3, C4, C5, C6, C8, C9, C10, C12, C13, C14, C15, C16, C18, C20, C22, C24, C26, C28 or the like.

In the present disclosure, C4-C30 may be C4, C5, C6, C8, C9, C10, C12, C13, C14, C15, C16, C18, C20, C22, C24, C26, C28 or the like.

In the present disclosure, C3-C30 may be C3, C4, C5, C6, C8, C9, C10, C12, C13, C14, C15, C16, C18, C20, C22, C24, C26, C28 or the like.

Specifically, C1-C20 linear or branched alkyl may be C1, C2, C3, C4, C5, C6, C8, C9, C10, C12, C13, C14, C15, C16, C18 linear or branched alkyl or the like, preferably C1-C10 linear or branched alkyl. For example, C1-C20 linear or branched alkyl includes, but is not limited to, methyl, ethyl, n-propyl, isopropyl, n-butyl, isobutyl, tert-butyl, n-pentyl, isopentyl, neopentyl, n-hexyl, n-octyl, n-heptyl, n-nonyl, n-decyl or the like.

A specific example of C1-C20 (for example, C1, C2, C3, C4, C5, C6, C8, C9, C10, C12, C13, C14, C15, C16, C18 or the like) alkoxy is that O and linear or branched alkyl listed above are joined to form a monovalent group.

A specific example of C3-C20 (for example, C3, C4, C5, C6, C8, C9, C10, C12, C13, C14, C15, C16, C18 or the like) alkylsilyl is that at least one H in —SiH$_3$ is substituted with alkyl listed above to form a monovalent group.

C3-C20 cycloalkyl may be C3, C4, C5, C6, C8, C9, C10, C12, C13, C14, C15, C16, C18, C20, C22, C24, C26, C28 cycloalkyl or the like. For example, C3-C20 cycloalkyl includes, but is not limited to, cyclopropyl, cyclobutyl, cyclopentyl, cyclohexyl, adamantyl or the like.

C6-C30 aryl may be C6, C8, C9, C10, C12, C13, C14, C15, C16, C18, C20, C22, C24, C26, C28 aryl or the like, preferably C6-C20 aryl, more preferably C6-C18 aryl. For example, C6-C30 aryl includes, but is not limited to, phenyl, biphenyl, terphenyl, naphthyl, anthryl, phenanthryl, indenyl, fluorenyl and derivatives thereof (9,9-dimethylfluorenyl, 9,9-diethylfluorenyl, 9,9-diphenylfluorenyl, 9,9-dinaphthylfluorenyl, spirodifluorenyl, benzofluorenyl or the like) fluoranthenyl, triphenylene, pyrenyl, perylenyl, chrysene, naphthacenyl or the like.

C2-C30 heteroaryl may be C2, C3, C4, C5, C6, C8, C9, C10, C12, C13, C14, C15, C16, C18, C20, C22, C24, C26, C28 heteroaryl or the like, preferably C3-C20 heteroaryl, more preferably C3-C18 heteroaryl, wherein a heteroatom includes O, S, N, P, B or the like. For example, C2-C30 heteroaryl includes, but is not limited to, furanyl, thienyl, pyrrolyl, pyridyl, pyrazinyl, pyridazinyl, pyrimidinyl, triazinyl, quinolyl, isoquinolyl, quinazolinyl, quinoxalinyl, cinnolinyl, pyridopyridinyl, an o-phenanthroline group, imidazolyl, thiazolyl, oxazolyl, pyrazolyl, thiadiazolyl, oxadiazolyl, benzimidazolyl, benzothiazolyl, benzoxazolyl or the like.

A specific example of C6-C30 (for example, C6, C9, C10, C12, C14, C16, C18, C20, C22, C24, C26, C28 or the like) ketoaryl is that

(a ketone group) and aryl listed above are joined to form a monovalent group.

A specific example of C4-C30 (for example, C4, C5, C6, C9, C10, C12, C14, C16, C18, C20, C22, C24, C26, C28 or the like) ketoheteroaryl is that

and at least one heteroaryl listed above are joined to form a monovalent group.

A specific example of C6-C30 (for example, C6, C9, C10, C12, C14, C16, C18, C20, C22, C24, C26, C28 or the like) aryl sulfonyl is that

(sulfonyl) and aryl listed above are joined to form a monovalent group.

A specific example of C6-C30 (for example, C6, C9, C10, C12, C14, C16, C18, C20, C22, C24, C26, C28 or the like) aryl phosphoroso is that

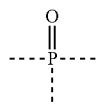

(phosphoroso) and aryl listed above are joined to form a monovalent group.

A specific example of C6-C30 (for example, C6, C9, C10, C12, C14, C16, C18, C20, C22, C24, C26, C28 or the like) arylsilyl is that at least one H in —SiH$_3$ is substituted with aryl listed above to form a monovalent group.

In the present disclosure, the term "electron withdrawing group" refers to a group which substitutes hydrogen of a benzene ring so that an electron cloud density of the benzene ring is reduced. For example, the electron withdrawing group includes, but is not limited to, halogen, cyano, isocyano, a sulfo group, triazinyl, pyrimidinyl, pyrazinyl, pyridazinyl, quinolyl, isoquinolyl, quinazolinyl, quinoxalinyl, benzopyrimidinyl, naphthyridinyl, diazaphenanthryl, ketoaryl, ketoheteroaryl, aryl sulfonyl, aryl phosphoroso and the above groups substituted with substituents, or aryl, alkyl, alkoxy or the like substituted with the above groups.

In the present disclosure, "halogenated" means that at least one hydrogen in a group is substituted with halogen (F, Cl, Br or I), and the substitution may be mono-substitution or multiple substitutions.

In the present disclosure, the "substituted or unsubstituted" group may be substituted with one substituent or multiple substituents. In the presence of multiple (at least two) substituents, the multiple (at least two) substituents are the same group or different groups. The substituent(s) may be joined at any position of the group where the substituent (s) can be joined. The same expression in the following has the same meaning.

In an embodiment, the substituted substituents in R, $R_1$ and $R_2$ are each independently selected from at least one of halogen, cyano, isocyano, a sulfo group, methylsilyl, unsubstituted or halogenated C1-C10 (for example, C1, C2, C3, C4, C5, C6, C7, C8, C9 or C10) linear or branched alkyl, unsubstituted or halogenated C1-C10 (for example, C1, C2, C3, C4, C5, C6, C7, C8, C9 or C10) alkoxy, unsubstituted or halogenated C1-C10 (for example, C1, C2, C3, C4, C5, C6, C7, C8, C9 or C10) alkylthio, unsubstituted or $R_{21}$-substituted C6-C18 (for example, C6, C9, C10, C12, C14, C16, C18 or the like) aryl, or unsubstituted or $R_{21}$-substituted C3-C18 (for example, C3, C4, C5, C6, C9, C10, C12, C14, C16, C18 or the like) heteroaryl.

In an embodiment, substituents in substituted heteroaryl, substituted ketoaryl, substituted ketoheteroaryl, substituted aryl sulfonyl and substituted aryl phosphoroso in R', R" and R'" are each independently selected from at least one of halogen, cyano, isocyano, a sulfo group, unsubstituted or halogenated C1-C10 (for example, C1, C2, C3, C4, C5, C6, C7, C8, C9 or C10) linear or branched alkyl, unsubstituted or halogenated C1-C10 (for example, C1, C2, C3, C4, C5, C6, C7, C8, C9 or C10) alkoxy, unsubstituted or halogenated C1-C10 (for example, C1, C2, C3, C4, C5, C6, C7, C8, C9 or C10) alkylthio, unsubstituted or $R_{21}$-substituted C6-C18 (for example, C6, C9, C10, C12, C14, C16, C18 or the like) aryl, or unsubstituted or $R_{21}$-substituted C3-C18 (for example, C3, C4, C5, C6, C9, C10, C12, C14, C16, C18 or the like) heteroaryl.

$R_{21}$ is each independently selected from at least one of halogen, cyano, isocyano, a sulfo group, halogenated C1-C10 (for example, C1, C2, C3, C4, C5, C6, C7, C8, C9 or C10) linear or branched alkyl or halogenated C1-C10 (for example, C1, C2, C3, C4, C5, C6, C7, C8, C9 or C10) alkoxy.

In an embodiment, the number of N in $X_1$, $X_2$, $X_3$ and $X_4$ is 0 to 2, for example, the number of N in $X_1$, $X_2$, $X_3$ and $X_4$ is 0, 1 or 2.

In an embodiment, $X_1$ and $X_3$ are the same atom, and $X_2$ and $X_4$ are the same atom.

When the "same atom" is CR, two R are the same group or different groups, further preferably the same.

In an embodiment, the structure of the parent core of the organic compound is a symmetric structure, that is, $X_1$ and $X_3$ are the same atom, and $X_2$ and $X_4$ are the same atom. An organic compound with a symmetric parent core is easier to synthesize, conducive to improving the anisotropy of molecules so that the organic compound has higher transmission efficiency and more conducive to improving a lifetime and efficiency of an organic electroluminescent device and reducing a drive voltage.

In an embodiment, each of $X_1$, $X_2$, $X_3$ and $X_4$ is CR, and four R are the same group or different groups.

In an embodiment, the number of N in $X_1$, $X_2$, $X_3$ and $X_4$ is 2.

In an embodiment, $X_1$ and $X_3$ are N; $X_2$ and $X_4$ are CR, and two R are the same group or different groups.

In another embodiment, $X_2$ and $X_4$ are N; $X_1$ and $X_3$ are CR, and two R are the same group or different groups.

In an embodiment, the organic compound has a structure represented by any one of Formula IA, Formula IB or Formula IC:

Formula IA

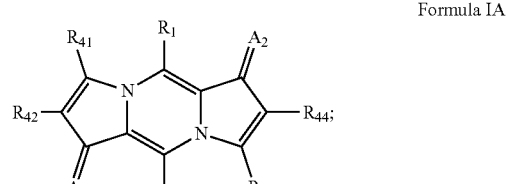

Formula IB

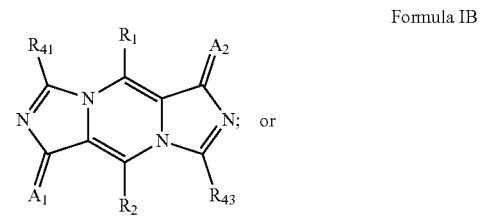

Formula IC

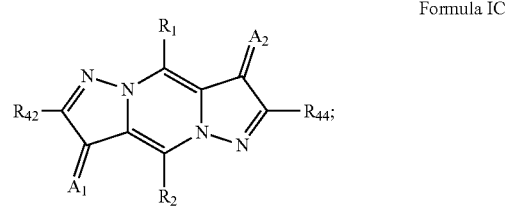

wherein, $R_1$, $R_2$, $A_1$ and $A_2$ have the same limited range as that in Formula I;

$R_{41}$, $R_{42}$, $R_{43}$ and $R_{44}$ have the same limited range as R, that is, $R_{41}$, $R_{42}$, $R_{43}$ and $R_{44}$ are each independently selected from any one of hydrogen, halogen, cyano, isocyano, substituted or unsubstituted C1-C20 linear or branched alkyl, substituted or unsubstituted C1-C20 alkoxy, substituted or unsubstituted C3-C20 cycloalkyl, substituted or unsubstituted C6-C30 aryl, substituted or unsubstituted C2-C30 heteroaryl, C6-C30 ketoaryl, C4-C30 ketoheteroaryl, C6-C30 aryl sulfonyl, C6-C30 aryl phosphoroso, C3-C20 alkylsilyl, C6-C30 arylsilyl, a phosphino group, an acyl group, a carboxyl group, an ester group, a sulfonyl group or a sulfinyl group.

In an embodiment, R, $R_1$ and $R_2$ are each independently selected from any one of hydrogen, halogen, cyano, isocyano, unsubstituted or halogenated C1-C10 (for example, C1, C2, C3, C4, C5, C6, C7, C8, C9 or C10) linear or branched alkyl, unsubstituted or halogenated C1-C10 (for example, C1, C2, C3, C4, C5, C6, C7, C8, C9 or C10) alkoxy, substituted or unsubstituted C6-C20 (for example, C6, C9, C10, C12, C14, C16, C18 or the like) aryl, or substituted or unsubstituted C2-C20 (for example, C2, C3, C4, C5, C6, C9, C10, C12, C14, C16, C18 or the like) heteroaryl.

The substituted substituents are each independently selected from at least one of halogen, cyano, isocyano, a sulfo group, methylsilyl, unsubstituted or halogenated C1-C10 (for example, C1, C2, C3, C4, C5, C6, C7, C8, C9 or C10) linear or branched alkyl, unsubstituted or halogenated C1-C10 (for example, C1, C2, C3, C4, C5, C6, C7, C8, C9 or C10) alkoxy, unsubstituted or halogenated C1-C10 (for example, C1, C2, C3, C4, C5, C6, C7, C8, C9 or C10) alkylthio, unsubstituted or $R_{21}$-substituted C6-C12 (for example, C6, C9, C10, C12 or the like) aryl, or unsubstituted or $R_{21}$-substituted C3-C12 (for example, C3, C4, C5, C6, C9, C10, C12 or the like) heteroaryl.

$R_{21}$ is each independently selected from at least one of halogen, cyano, isocyano, a sulfo group, halogenated C1-C6 (for example, C1, C2, C3, C4, C5 or C6) linear or branched alkyl, or halogenated C1-C6 (for example, C1, C2, C3, C4, C5 or C6) alkoxy.

In an embodiment, R, $R_1$ and $R_2$ are each independently selected from any one of hydrogen, fluorine, cyano, isocyano, unsubstituted or fluorinated C1-C6 (for example, C1, C2, C3, C4, C5 or C6) linear or branched alkyl, unsubstituted or fluorinated C1-C6 (for example, C1, C2, C3, C4, C5 or C6) alkoxy, substituted or unsubstituted phenyl, substituted or unsubstituted biphenyl, substituted or unsubstituted naphthyl, or substituted or unsubstituted C2-C8 (for example, C2, C3, C4, C5, C6, C7 or C8) nitrogen-containing heteroaryl.

The substituted substituents are each independently selected from at least one of fluorine, cyano, isocyano, a sulfo group, methylsilyl, unsubstituted or fluorinated C1-C6 (for example, C1, C2, C3, C4, C5 or C6) linear or branched alkyl, unsubstituted or fluorinated C1-C6 (for example, C1, C2, C3, C4, C5 or C6) alkoxy, or unsubstituted or fluorinated C1-C6 (for example, C1, C2, C3, C4, C5 or C6) alkylthio.

In an embodiment, R, $R_1$ and $R_2$ are each independently selected from hydrogen, fluorine, cyano, isocyano, methyl, ethyl, perfluoromethyl, perfluoroethyl,

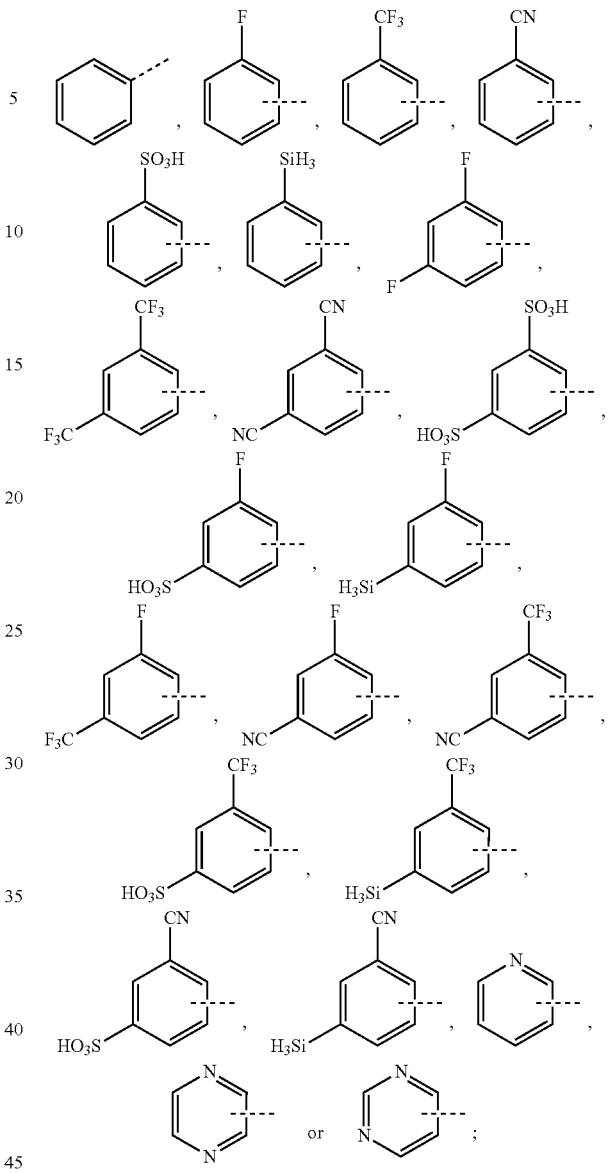

wherein the dashed line represents a linkage site of the group.

In an embodiment, in the Formula IA, Formula IB and Formula IC, $R_{41}$, $R_{42}$, $R_{43}$ and $R_{44}$ are each independently selected from any one of hydrogen, halogen, cyano, isocyano, a sulfo group, unsubstituted or halogenated C1-C10 (for example, C1, C2, C3, C4, C5, C6, C7, C8, C9 or C10) linear or branched alkyl, unsubstituted or halogenated C1-C10 (for example, C1, C2, C3, C4, C5, C6, C7, C8, C9 or C10) alkoxy, substituted or unsubstituted C6-C20 (for example, C6, C9, C10, C12, C14, C16, C18 or the like) aryl, or substituted or unsubstituted C2-C20 (for example, C2, C3, C4, C5, C6, C9, C10, C12, C14, C16, C18 or the like) heteroaryl.

The substituted substituents are each independently selected from at least one of halogen, cyano, isocyano, a sulfo group, unsubstituted or halogenated C1-C10 (for example, C1, C2, C3, C4, C5, C6, C7, C8, C9 or C10) linear or branched alkyl, unsubstituted or halogenated C1-C10 (for example, C1, C2, C3, C4, C5, C6, C7, C8, C9 or C10)

alkoxy, unsubstituted or halogenated C1-C10 (for example, C1, C2, C3, C4, C5, C6, C7, C8, C9 or C10) alkylthio, unsubstituted or $R_{21}$-substituted C6-C12 (for example, C6, C9, C10, C12 or the like) aryl, or unsubstituted or $R_{21}$-substituted C3-C12 (for example, C3, C4, C5, C6, C9, C10, C12 or the like) heteroaryl.

$R_{21}$ is each independently selected from at least one of halogen, cyano, isocyano, a sulfo group, halogenated C1-C6 (for example, C1, C2, C3, C4, C5 or C6) linear or branched alkyl or halogenated C1-C6 (for example, C1, C2, C3, C4, C5 or C6) alkoxy.

In an embodiment, in the Formula IA, Formula IB and Formula IC, $R_{41}$, $R_{42}$, $R_{43}$ and $R_{44}$ are each independently selected from any one of hydrogen, fluorine, cyano, isocyano, a sulfo group, unsubstituted or fluorinated C1-C6 (for example, C1, C2, C3, C4, C5 or C6) linear or branched alkyl, unsubstituted or fluorinated C1-C6 (for example, C1, C2, C3, C4, C5 or C6) alkoxy, substituted or unsubstituted phenyl, substituted or unsubstituted biphenyl, substituted or unsubstituted naphthyl, or substituted or unsubstituted C2-C8 (for example, C2, C3, C4, C5, C6, C7 or C8) nitrogen-containing heteroaryl.

The substituted substituents are each independently selected from at least one of fluorine, cyano, isocyano, a sulfo group, unsubstituted or fluorinated C1-C6 (for example, C1, C2, C3, C4, C5 or C6) linear or branched alkyl, unsubstituted or fluorinated C1-C6 (for example, C1, C2, C3, C4, C5 or C6) alkoxy, or unsubstituted or fluorinated C1-C6 (for example, C1, C2, C3, C4, C5 or C6) alkylthio.

In an embodiment, in the Formula IA, Formula IB and Formula IC, $R_{41}$, $R_{42}$, $R_{43}$ and $R_{44}$ are each independently selected from hydrogen, fluorine, cyano, isocyano, a sulfo group, methyl, ethyl, perfluoromethyl, perfluoroethyl,

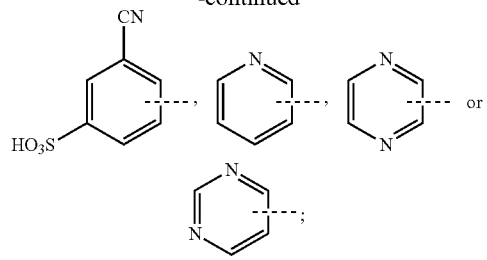

wherein the dashed line represents a linkage site of the group.

In an embodiment, $A_1$ and $A_2$ are each independently selected from NR' or CR"R'". R', R" and R'" are electron withdrawing groups so that $A_1$ and $A_2$ have a strong electron withdrawing property. $A_1$ and $A_2$ are compounded with the structure of the parent core so that the organic compound has a deeper LUMO energy level of −5.19 eV to −5.64 eV and a HOMO energy level of −7.52 eV to −8.03 eV. The LUMO energy level is close to the anode work function and the HOMO energy level of the hole transport layer and may be used for the charge injection layer (hole injection layer) of the OLED device as the P-type doped material so that the device has more excellent overall performance and is particularly outstanding in terms of voltage reduction and lifetime improvement.

In an embodiment, R', R" and R'" are each independently selected from any one of halogen, cyano, isocyano, a sulfo group, halogenated C1-C10 (for example, C1, C2, C3, C4, C5, C6, C7, C8, C9 or C10) linear or branched alkyl, halogenated C1-C10 (for example, C1, C2, C3, C4, C5, C6, C7, C8, C9 or C10) alkoxy,

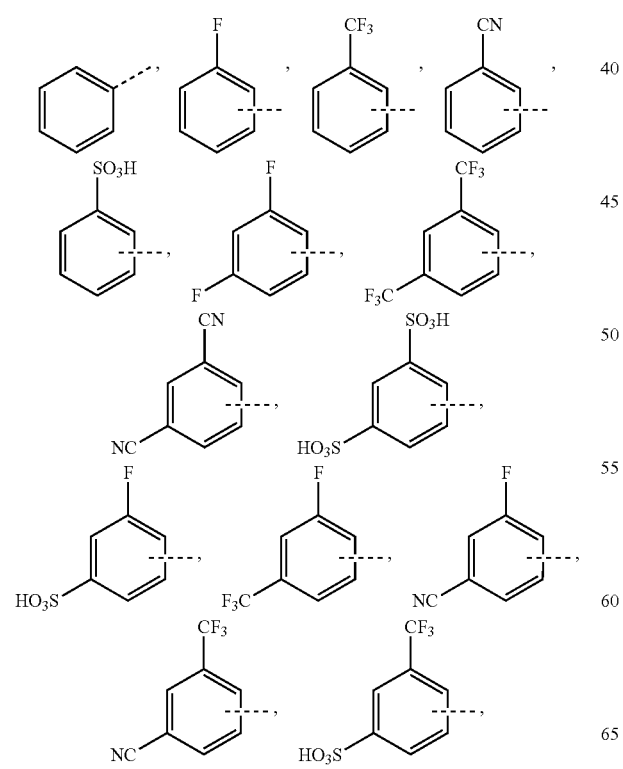

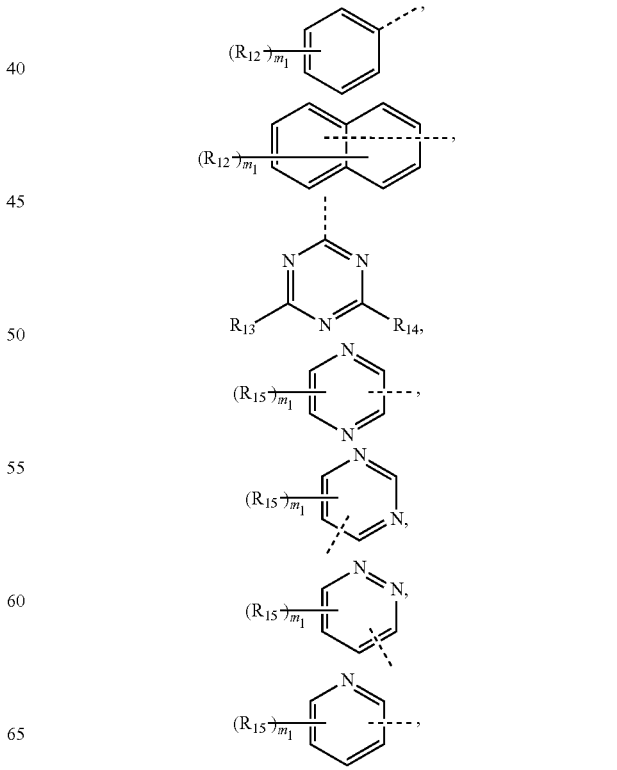

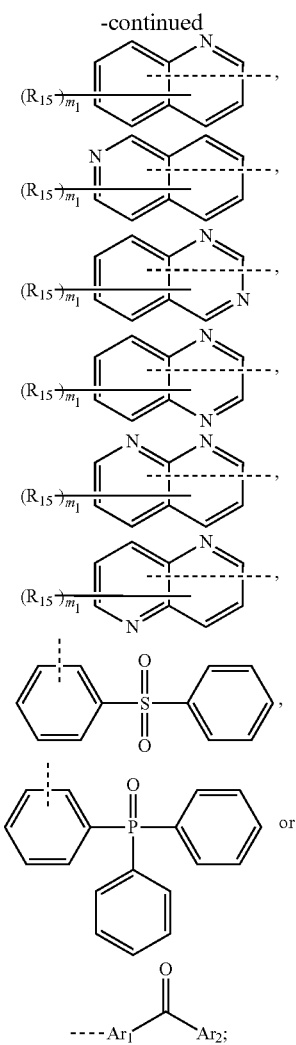

wherein, the dashed line represents a linkage site of the group;

$R_{12}$ is selected from any one of halogen, cyano, isocyano, a sulfo group, halogenated C1-C10 (for example, C1, C2, C3, C4, C5, C6, C7, C8, C9 or C10) linear or branched alkyl or halogenated C1-C10 (for example, C1, C2, C3, C4, C5, C6, C7, C8, C9 or C10) alkoxy;

$R_{13}$ and $R_{14}$ are each independently selected from any one of hydrogen, halogen, cyano, isocyano, a sulfo group, unsubstituted or halogenated C1-C10 (for example, C1, C2, C3, C4, C5, C6, C7, C8, C9 or C10) linear or branched alkyl, unsubstituted or halogenated C1-C10 (for example, C1, C2, C3, C4, C5, C6, C7, C8, C9 or C10) alkoxy, unsubstituted or halogenated C1-C10 (for example, C1, C2, C3, C4, C5, C6, C7, C8, C9 or C10) alkylthio, unsubstituted or $R_{21}$-substituted C6-C18 (for example, C6, C9, C10, C12, C14, C16, C18 or the like) aryl, or unsubstituted or $R_{21}$-substituted C3-C18 (for example, C3, C4, C5, C6, C9, C10, C12, C14, C16, C18 or the like) heteroaryl;

An is selected from any one of unsubstituted or $R_{15}$-substituted phenylene, unsubstituted or $R_{15}$-substituted naphthylene, or unsubstituted or $R_{15}$-substituted C3-C9 (for example, C3, C4, C5, C6, C7, C8 or C9) nitrogen-containing heteroarylene;

$Ar_2$ is selected from any one of unsubstituted or $R_{15}$-substituted phenyl, unsubstituted or $R_{15}$-substituted naphthyl, or unsubstituted or $R_{15}$-substituted C3-C9 (for example, C3, C4, C5, C6, C7, C8 or C9) nitrogen-containing heteroaryl;

$R_{15}$ is selected from any one of halogen, cyano, isocyano, a sulfo group, unsubstituted or halogenated C1-C10 (for example, C1, C2, C3, C4, C5, C6, C7, C8, C9 or C10) linear or branched alkyl, unsubstituted or halogenated C1-C10 (for example, C1, C2, C3, C4, C5, C6, C7, C8, C9 or C10) alkoxy, unsubstituted or halogenated C1-C10 (for example, C1, C2, C3, C4, C5, C6, C7, C8, C9 or C10) alkylthio, unsubstituted or $R_{21}$-substituted C6-C18 (for example, C6, C9, C10, C12, C14, C16, C18 or the like) aryl, or unsubstituted or $R_{21}$-substituted C3-C18 (for example, C3, C4, C5, C6, C9, C10, C12, C14, C16, C18 or the like) heteroaryl;

$R_{21}$ is each independently selected from at least one of halogen, cyano, isocyano, a sulfo group, halogenated C1-C10 (for example, C1, C2, C3, C4, C5, C6, C7, C8, C9 or C10) linear or branched alkyl or halogenated C1-C10 (for example, C1, C2, C3, C4, C5, C6, C7, C8, C9 or C10) alkoxy; and mi represents the number of substituents $R_{15}$, which is selected from an integer from 0 to 3, for example, the number may be 0, 1, 2 or 3; when $m_1 \geq 2$, multiple (at least two) $R_{15}$ are the same group or different groups.

In an embodiment, $Ar_1$ is selected from any one of phenylene, naphthylene, pyridylene, pyrazinylene, pyrimidinylene, pyridazinylene, triazinylene, quinolylene, isoquinolylene, quinoxalinylene or quinazolinylene.

In an embodiment, $Ar_2$ is selected from any one of phenyl, naphthyl, pyridyl, pyrazinyl, pyrimidinyl, pyridazinyl, triazinyl, quinolyl, isoquinolyl, quinoxalinyl or quinazolinyl.

In an embodiment, R', R" and R'" are each independently selected from any one of fluorine, cyano, isocyano, fluorinated C1-C6 (for example, C1, C2, C3, C4, C5 or C6) linear or branched alkyl, flurorinated C1-C6 (for example, C1, C2, C3, C4, C5 or C6) alkoxy,

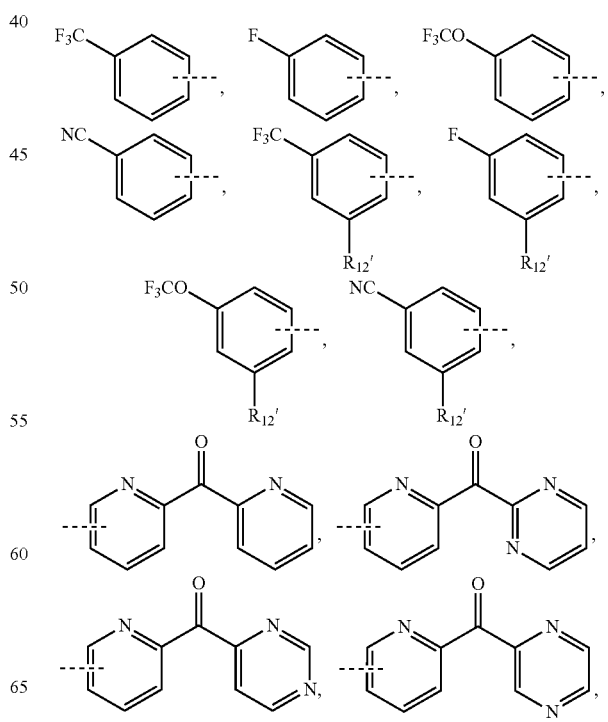

-continued

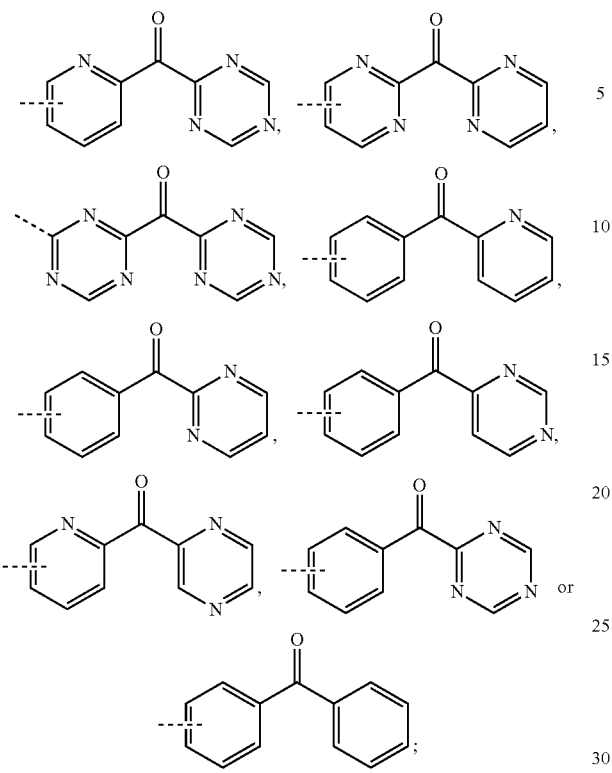

wherein, the dashed line represents a linkage site of the group; and $R_{12'}$ is selected from any one of fluorine, perfluoromethyl, perfluoromethoxy, cyano or isocyano.

In an embodiment, $A_1$ and $A_2$ are the same.

In an embodiment, $A_1$ and $A_2$ are the same, $R_1$ and $R_2$ are the same, $X_1$ and $X_3$ are the same, $X_2$ and $X_4$ are the same; and the organic compound with a symmetric molecular structure is not only easy to synthesize but also has higher anisotropy of molecules so that the organic compound has higher charge transmission efficiency and is more conducive to improving the lifetime and efficiency of the organic electroluminescent device and reducing the drive voltage.

As a specific embodiment, in the Formula IA, Formula IB and Formula IC, $A_1$ and $A_2$ are the same, $R_1$ and $R_2$ are the same, $R_{41}$ and $R_{43}$ are the same (Formula IA and Formula IB), and $R_{42}$ and $R_{44}$ are the same (Formula IA and Formula IC).

In an embodiment, the organic compound is selected from any one of the following Compounds P1 to P38:

P1

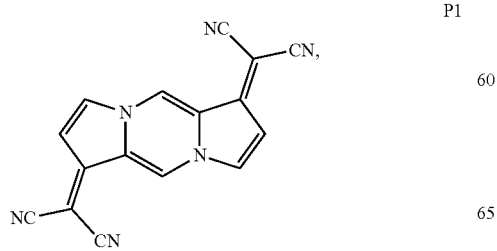

P2

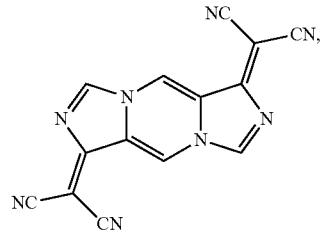

P3

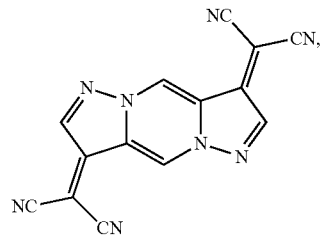

P4

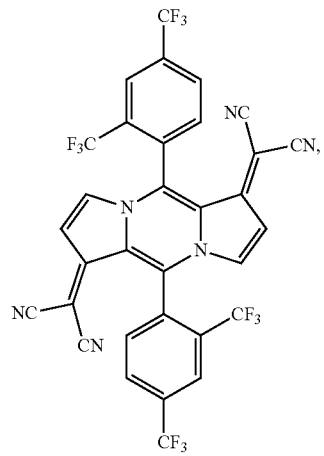

P5

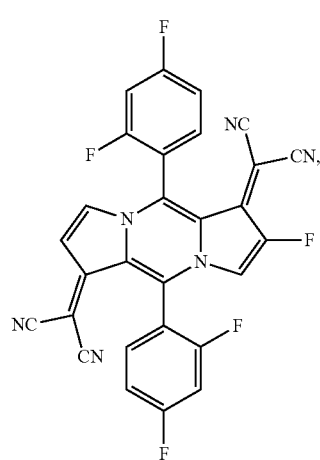

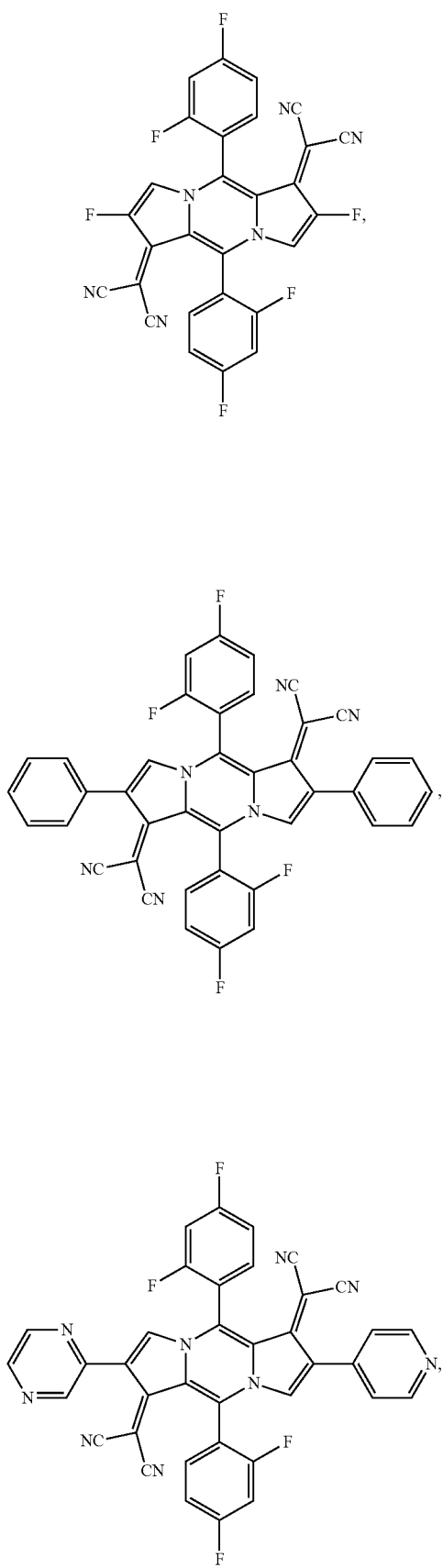

P13 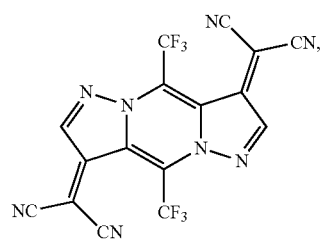
P14 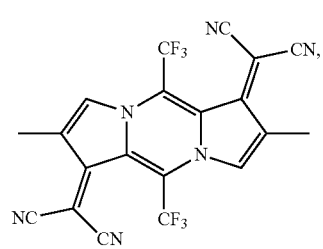
P15 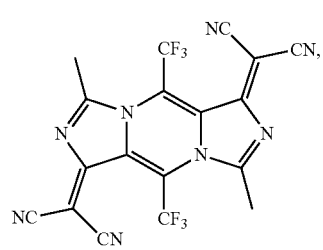
P16 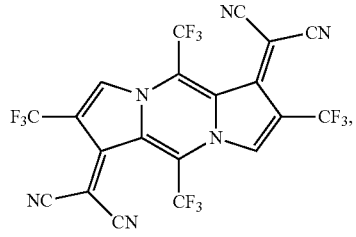
P17 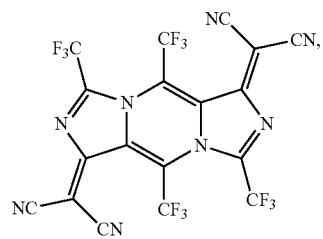
P18 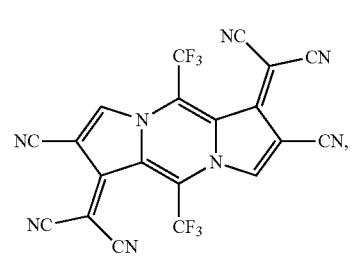
P19 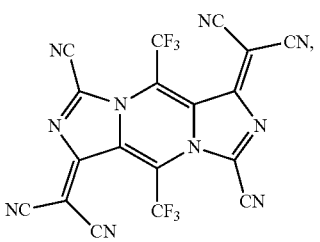
P20 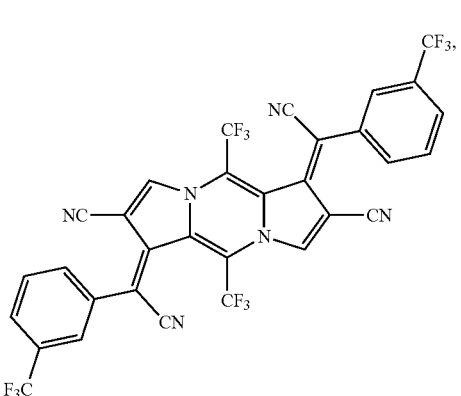
P21 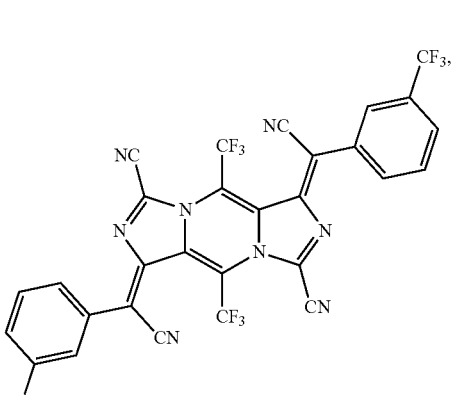
P22 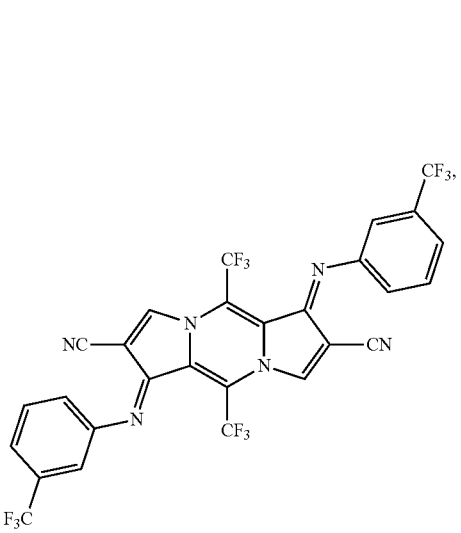

-continued
P23
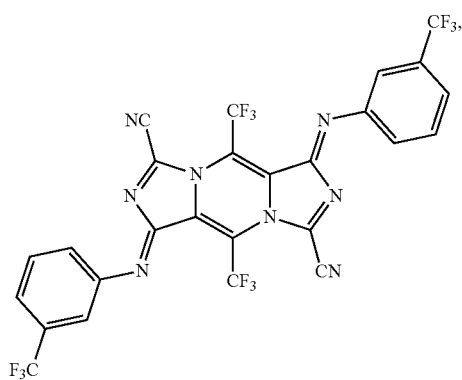
P24
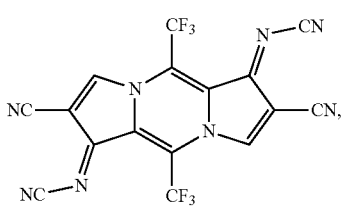
P25
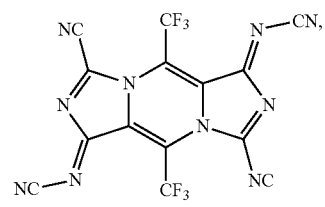
P26
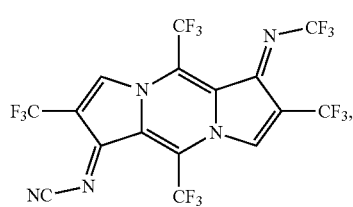
P27
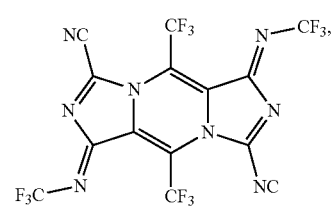
-continued
P28
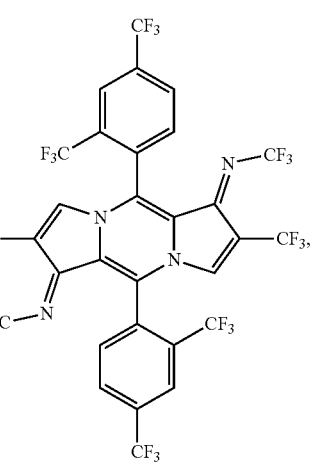
P29
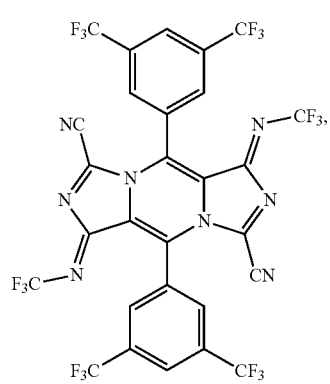
P30
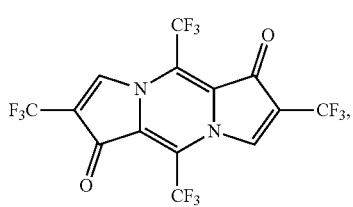
P31
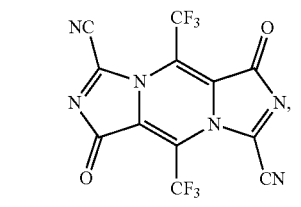
P32
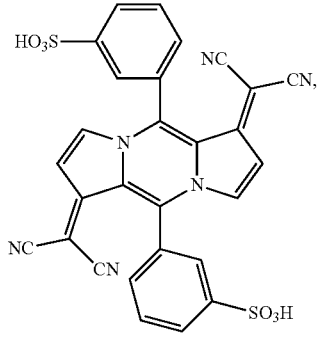

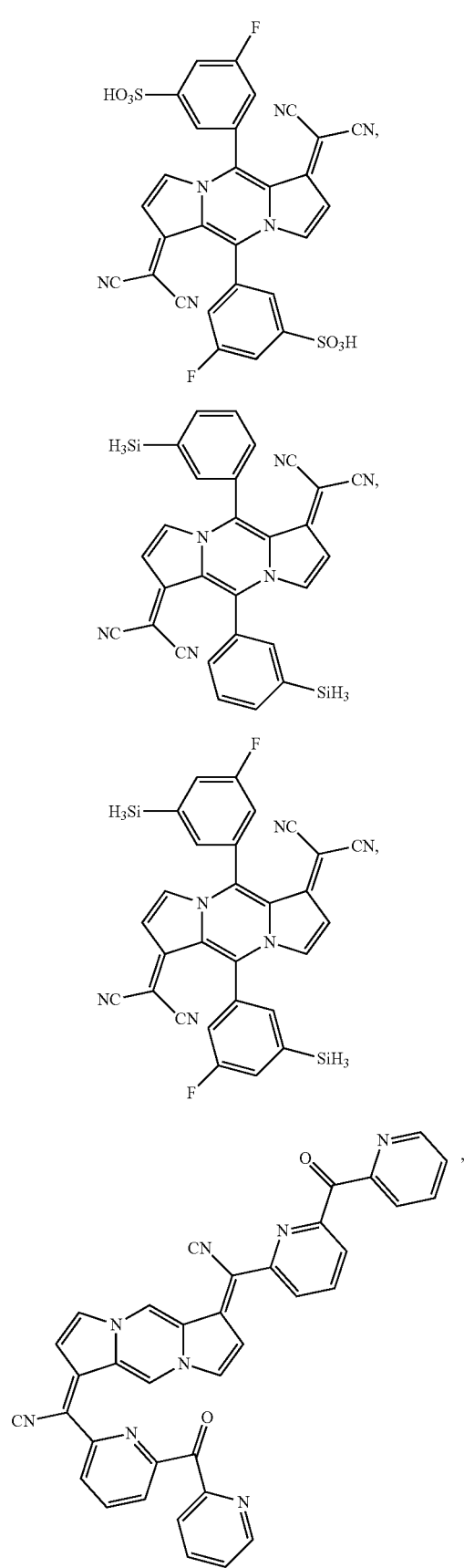
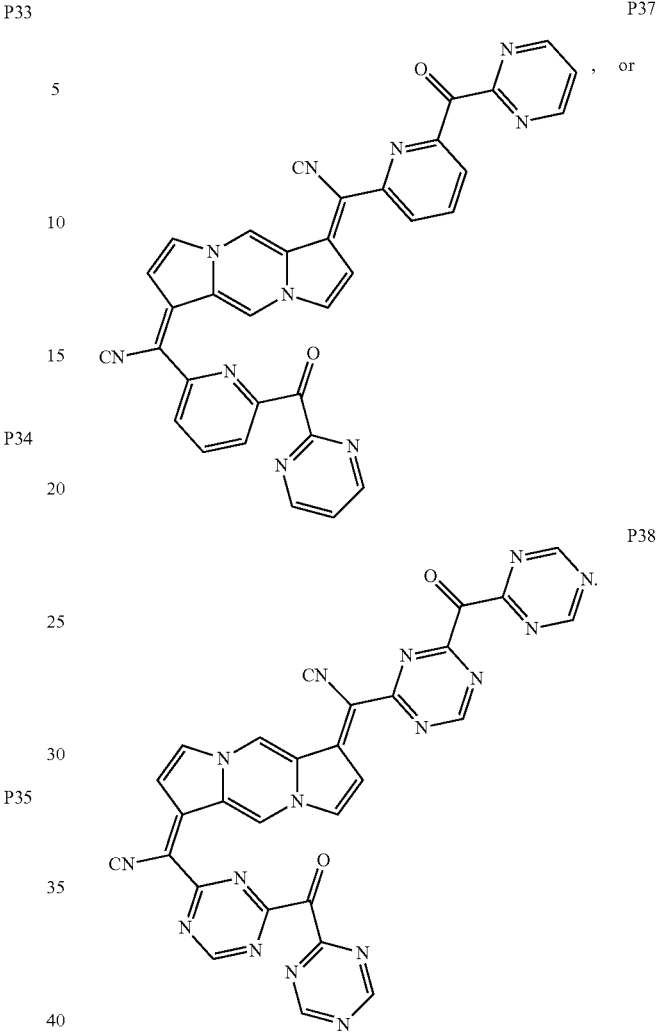

In an embodiment, the present disclosure provides a P-type doped material. The P-type doped material includes at least one of the organic compounds each as previously described.

In an embodiment, the present disclosure provides an organic light-emitting display panel. The organic light-emitting display panel includes an anode, a cathode and an organic layer disposed between the anode and the cathode, wherein a material of the organic layer includes the P-type doped material as previously described.

In an embodiment, the anode, the cathode and the organic layer disposed between the anode and the cathode constitute an organic electroluminescent device of the organic light-emitting display panel.

In an embodiment, the material of the organic layer includes at least one of the organic compounds each as previously described.

In an embodiment, the organic layer includes a hole injection layer. The hole injection layer includes the P-type doped material as previously described.

In an embodiment, a mass percentage content (doping ratio) of the P-type doped material in the hole injection layer is 0.1-10%, for example, the mass percentage content may be 0.3%, 0.5%, 0.8%, 1%, 2%, 3%, 4%, 5%, 6%, 7%, 8%, 9%, 9.5% or the like, further preferably 0.1-5%.

In an embodiment, the hole injection layer includes at least one of the organic compounds each as previously described.

In an embodiment, the hole injection layer further includes a matrix material. The matrix material is a hole transport compound.

In an embodiment, absolute value of a difference between a HOMO energy level of the matrix material and a LUMO energy level of the P-type doped material (the organic compound)≤0.3 eV, that is, |HOMO of the matrix material−LUMO of the P-type doped material|≤0.3 eV. The absolute value of the difference between the two may be 0.28 eV, 0.25 eV, 0.22 eV, 0.2 eV, 0.18 eV, 0.15 eV, 0.12 eV, 0.1 eV, 0.08 eV, 0.05 eV or the like.

In an embodiment, the hole transport compound includes an arylamine compound.

In an embodiment, an anode material is a conductive material having a high work function, which includes a metal, a metal oxide or a conductive polymer. The metal includes copper, gold, silver, iron, chromium, nickel, manganese, palladium, platinum or the like and alloys thereof. The metal oxide includes indium tin oxide (ITO), indium zinc oxide (IZO), zinc oxide, indium gallium zinc oxide (IGZO) or the like. The conductive polymer includes polyaniline, polypyrrole, poly(3-methylthiophene) or the like. In addition to the above materials that facilitate hole injection and combinations thereof, the anode material further includes known materials suitable for use as the anode.

In an embodiment, a cathode material is a conductive material having a low work function, which may be a metal or a multilayer metal material. The metal includes sodium, calcium, aluminum, magnesium, silver, indium, tin, titanium or the like and alloys thereof. The multilayer metal material includes LiF/Al, $LiO_2$/Al, $BaF_2$/Al or the like. In addition to the above materials that facilitate electron injection and combinations thereof, the cathode material further includes known materials suitable for use as the cathode.

In an embodiment, the organic layer includes at least one light-emitting layer (EML).

In an embodiment, the at least one light-emitting layer includes a combination of a host material and a dye.

In an embodiment, the hole injection layer (HIL) is disposed between the at least one light-emitting layer (EML) and the anode. The hole injection layer includes the P-type doped material as previously described.

In an embodiment, other functional layers are disposed on both sides of the at least one light-emitting layer (EML). The other functional layers includes any one or a combination of at least two of an electron transport layer (ETL), a hole transport layer (HTL), an electron blocking layer (EBL), a hole blocking layer (HBL) and an electron injection layer (EIL).

In an embodiment, as shown in the Figure which is a structure diagram of the organic electroluminescent device, the organic electroluminescent device includes an anode 110, a cathode 150, a light-emitting layer 130 disposed between the anode 110 and the cathode 150 and a first organic functional layer 120 and a second organic functional layer 140 which are disposed on both sides of the light-emitting layer 130. The first organic functional layer 120 is any one or a combination of at least two of a hole transport layer (HTL), a hole injection layer (HIL) or an electron blocking layer (EBL), and the second organic functional layer 140 includes any one or a combination of at least two of an electron transport layer (ETL), a hole blocking layer (HBL) or an electron injection layer (EIL). The first organic functional layer 120 includes the P-type doped material as previously described, and preferably the hole injection layer includes the P-type doped material as previously described.

After a voltage is applied across the two electrodes of the organic electroluminescent device, holes are injected from the anode 110 into the light-emitting layer 130 through the first organic functional layer 120, and N-type charges are injected from the cathode 150 into the light-emitting layer 130 through the second organic functional layer 140. The first organic functional layer 120 includes a P-type charge injection layer (hole injection layer), where the P-type charge injection layer includes the P-type doped material provided by the present disclosure, that is, the P-type charge injection layer includes at least one of the organic compounds each provided by the present disclosure.

The OLED device may be prepared by the following method: forming the anode on a transparent or opaque smooth substrate, forming an organic layer on the anode, and forming the cathode on the organic layer. The organic layer may be formed by a known film formation method such as deposition by means of evaporation, sputtering, spin coating, impregnation and ion plating.

In an embodiment, the present disclosure provides a display device. The display device includes the organic light-emitting display panel as previously described.

In an embodiment, the organic compound has a structure represented by Formula I, wherein both $A_1$ and $A_2$ are O. The organic compound is prepared by the following Synthesis Route I.

Synthesis Route I:

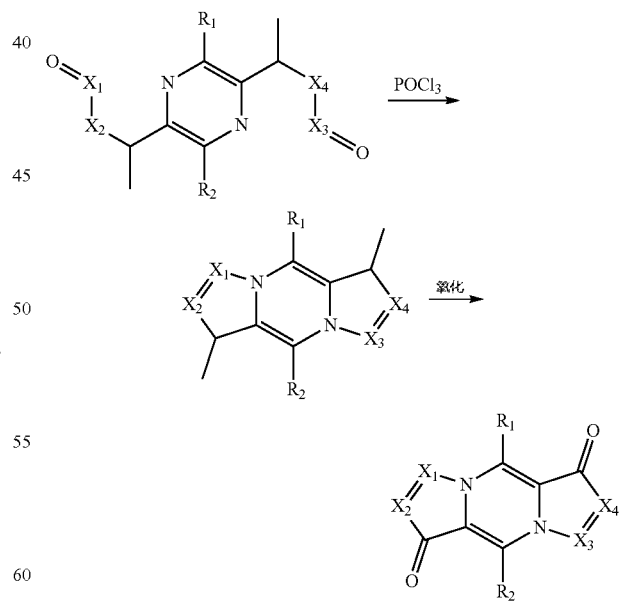

In an embodiment, the oxidation is carried out in the presence of hydrogen peroxide.

In an embodiment, both $A_1$ and $A_2$ are NR'. The organic compound is prepared by the following Synthesis Route II.

Synthesis Route II:

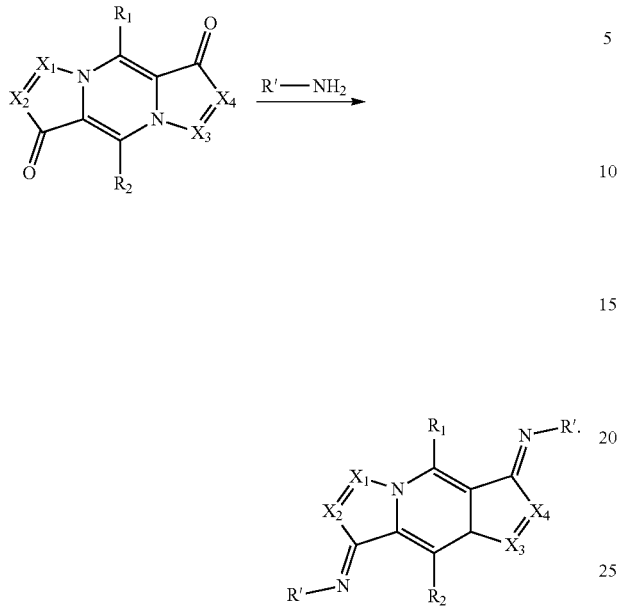

In an embodiment, both $A_1$ and $A_2$ are CR"R'". The organic compound is prepared by the following Synthesis Route III.

Synthesis Route III:

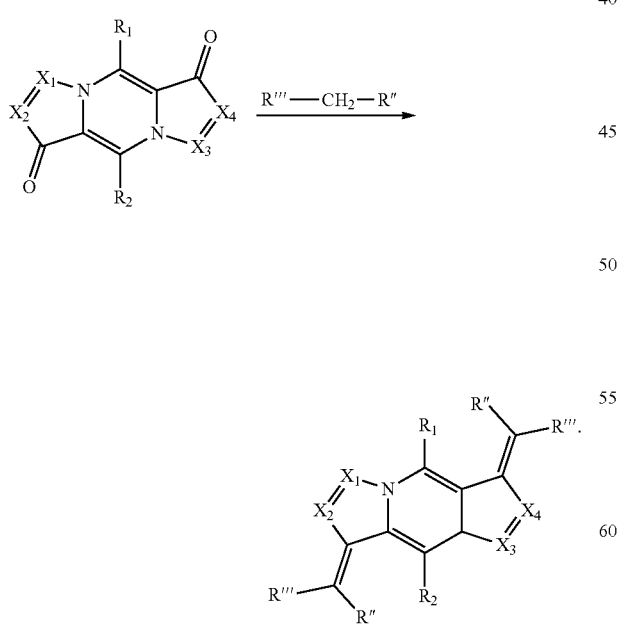

For example, several preparation examples of the organic compounds of the present disclosure are listed below.

Example 1

Organic Compound P4 has a structure of

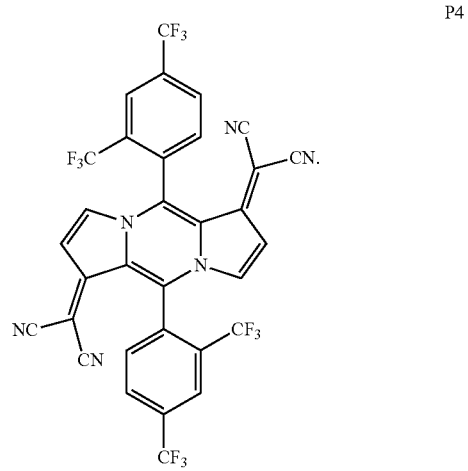 [SMILES: N#CC(C#N)=c1ccn2c(-c3ccc(C(F)(F)F)cc3C(F)(F)F)c3c(=C(C#N)C#N)ccn3c(-c3ccc(C(F)(F)F)cc3C(F)(F)F)c12]

A method for preparing Organic Compound P4 is described below.

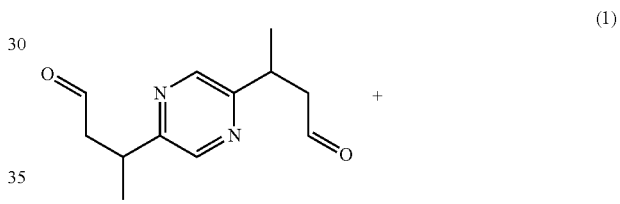

In a 250 mL three-necked flask, under nitrogen protection, the raw material S4-1 (2.2 g, 10 mmol) was dissolved in tetrahydrofuran (100 mL) and cooled to 0° C. n-Butyllithium (n-BuLi) (11 mmol) was slowly added dropwise to the reaction solution at a temperature which was controlled less than or equal to 5° C., and after dropping, the reaction solution was kept the temperature and stirred for 0.5 h. The raw material S4-2 (3 g, 10 mmol) was dissolved in a solution of tetrahydrofuran (50 mL) and slowly added dropwise to the reaction solution at a temperature which was controlled less than or equal to 5° C., and after dropping, the reaction solution was kept the temperature and stirred for 1 h. Then, the temperature was slowly raised to 25° C., and the reaction solution was kept the temperature and stirred for 2 h. Thin-layer chromatography (TLC) detected that the raw material S4-1 had no residues so that the reaction was performed completely. Deionized water (30 mL) was slowly added dropwise to quench the reaction, and layers were separated. An aqueous phase was extracted with toluene and dried, and an organic phase was concentrated. The organic phase was purified through column chromatography (petroleum ether:ethyl estate=5:1), and a liquid was concentrated to obtain Intermediate S4-3 (4.8 g in total with a yield of 74%).

raised until the reaction solution was boiled. The TLC detected that S4-3 had no residues so that the reaction was performed completely. The reaction solution was naturally cooled to room temperature, and a solution of dilute hydrochloric acid was added to quench the reaction solution. An aqueous phase was extracted with toluene, an organic phase was washed three times with water, dried and concentrated and purified through the column chromatography (petroleum ether:ethyl acetate=5:1), and a liquid was concentrated to obtain Intermediate S4-4 (4.2 g in total with a yield of 69%).

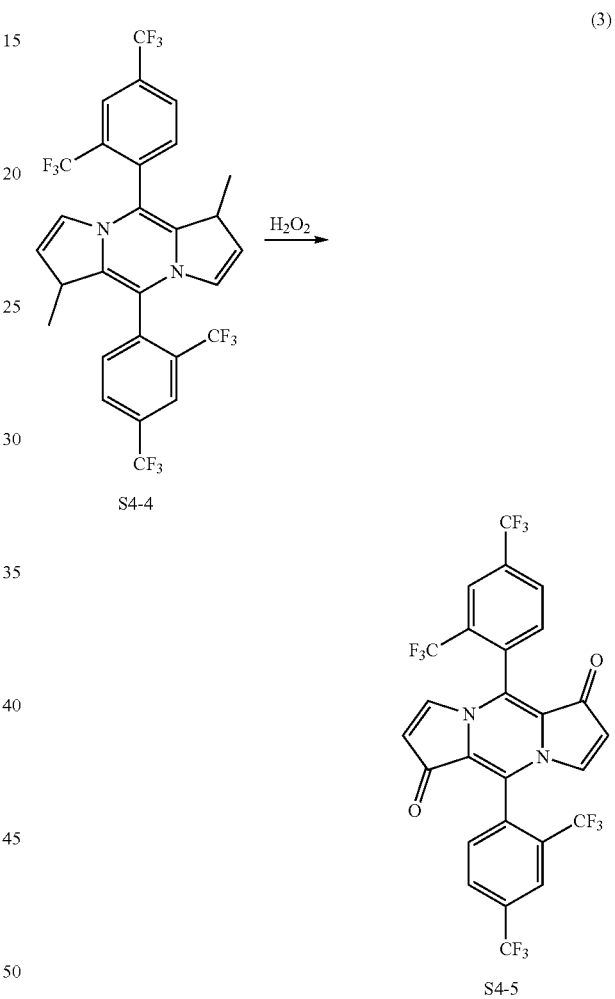

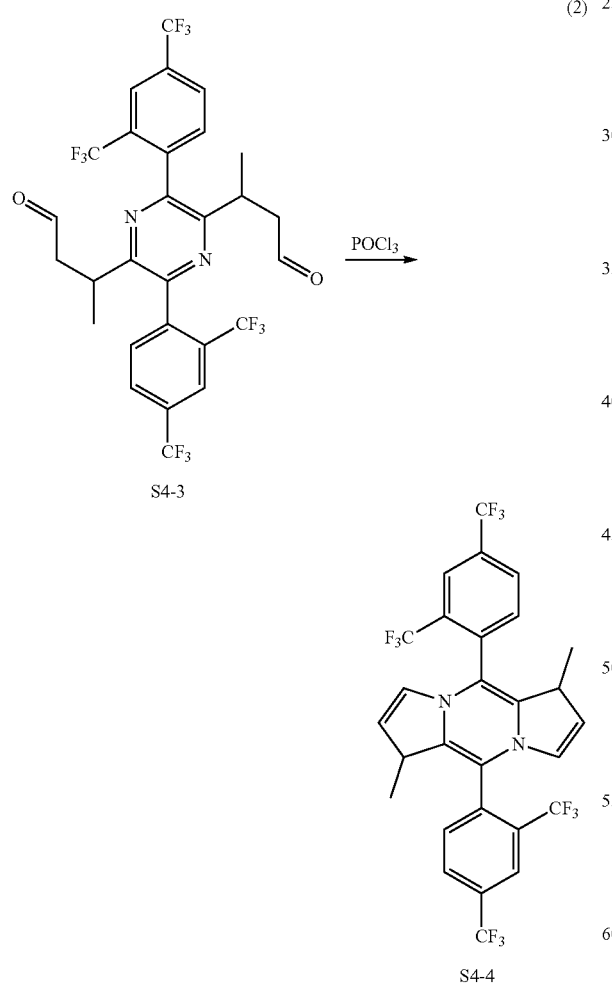

In a 250 mL three-necked flask, under nitrogen protection, Intermediate S4-3 (6.4 g, 10 mmol) was added and dissolved in phosphorus oxychloride (100 mL), an exhaust gas absorption apparatus was added, and the temperature was slowly In a 250 mL three-necked flask, Intermediate S4-4 (6.1 g, 10 mmol) was added and dissolved in a solution of acetic acid (100 mL). Hydrogen peroxide (20 mmol) was slowly added dropwise, and after dropping, the temperature was raised until the reaction solution was boiled. The TLC detected that S4-4 had no residues so that the reaction was performed completely. The reaction solution was naturally cooled to room temperature, and a solution of dilute hydrochloric acid was added to quench the reaction solution. An aqueous phase was extracted with toluene, an organic phase was washed three times with water, dried and concentrated and purified through the column chromatography (petroleum ether:ethyl acetate=5:1), and a liquid was concentrated to obtain Intermediate S4-5 (3.8 g in total with a yield of 62%).

(4)

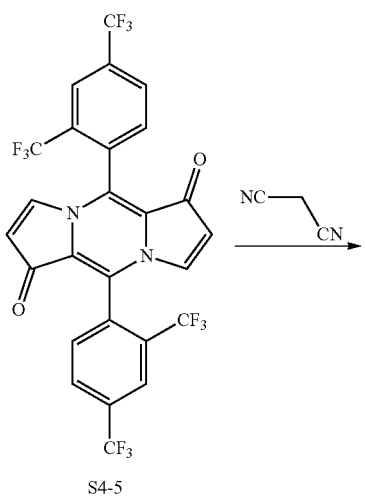

S4-5

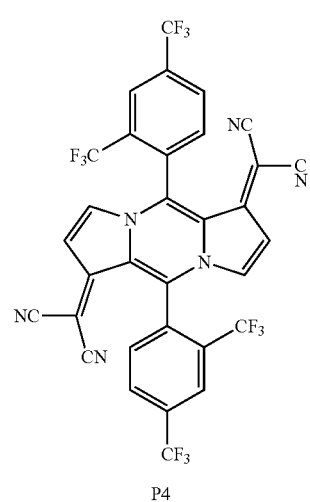

P4

In a 250 mL three-necked flask, Intermediate S4-5 (6.1 g, 10 mmol) was added and dissolved in a solution of malononitrile (100 mL). Under nitrogen protection, titanium tetrachloride (3.8 g, 20 mmol) and pyridine (2 mL) were added slowly, and after adding, the reaction solution was stirred for 24 h. The TLC detected that S4-5 had no residues so that the reaction was performed completely. An organic phase was washed with a saturated solution of ammonium chloride, washed three times with water, dried and concentrated and purified through the column chromatography (petroleum ether:ethyl acetate=5:1), and a liquid was concentrated to obtain the target product P4 (5.4 g in total with a yield of 71%).

Structural characterization of Organic Compound P4: $C_{32}H_{10}F_{12}N_6$; mass spectrometry (MS) $(M+H)^+$: calculated value: 707.44; measured value: 707.58.

Example 2

Organic Compound P7 has a structure of

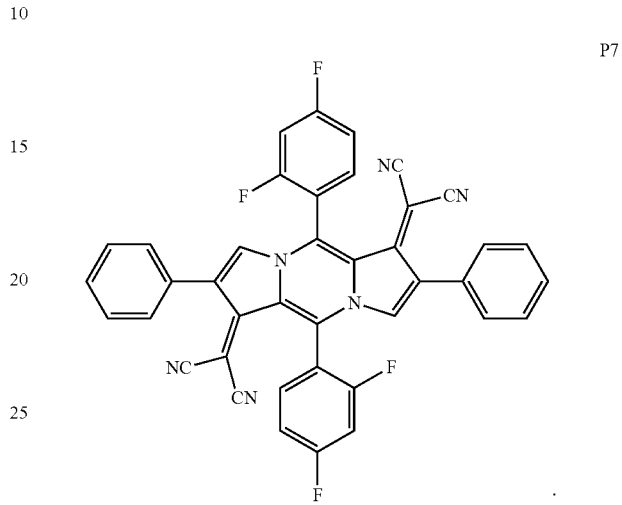

A method for preparing Organic Compound P7 is described below:

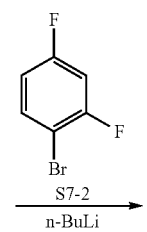

S7-1    S7-2

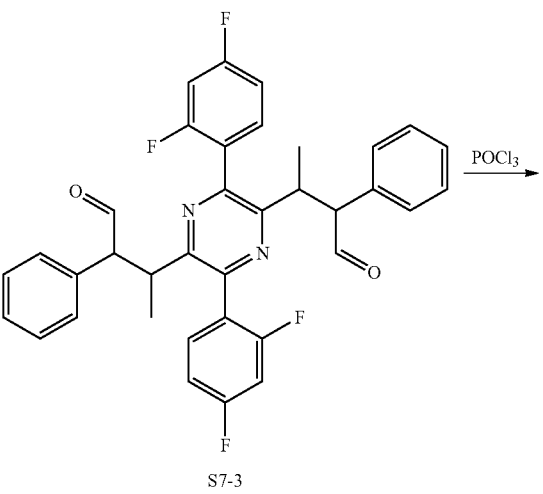

S7-3

Example 3

Organic Compound P12 has a structure of

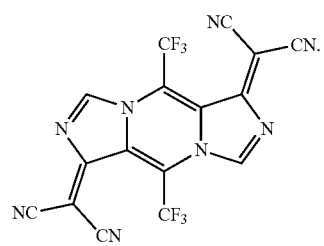

A method for preparing Organic Compound P12 is described below:

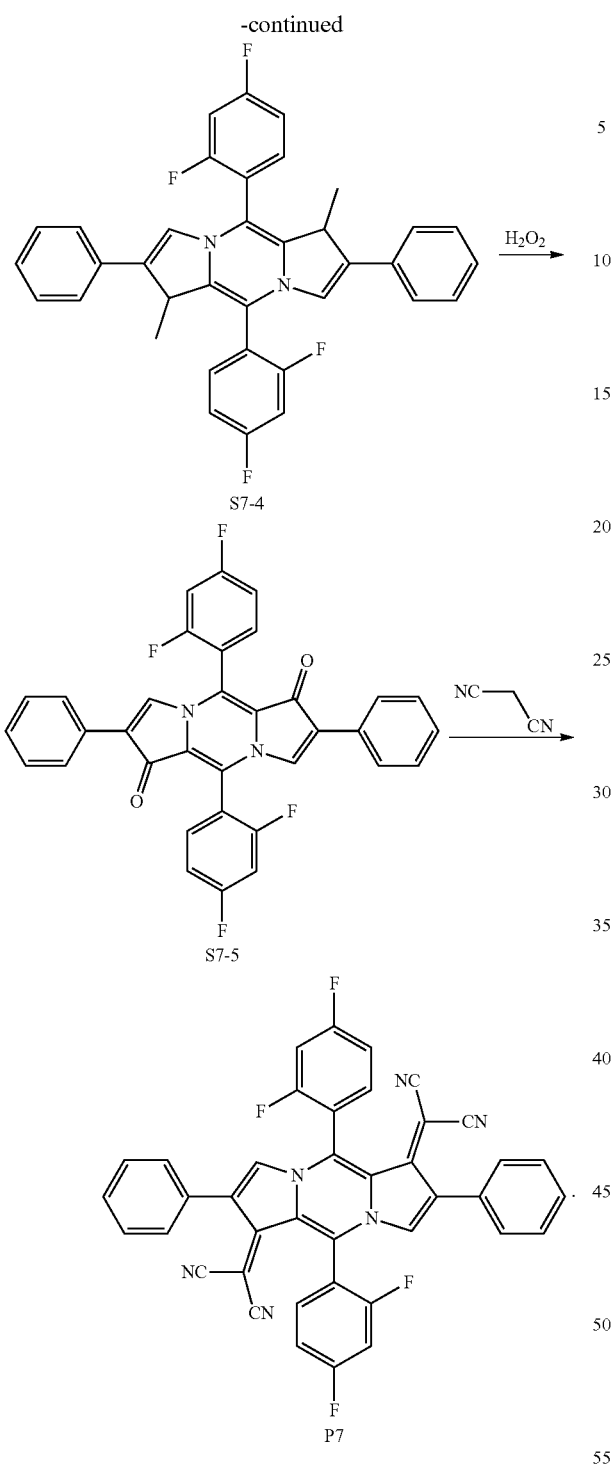

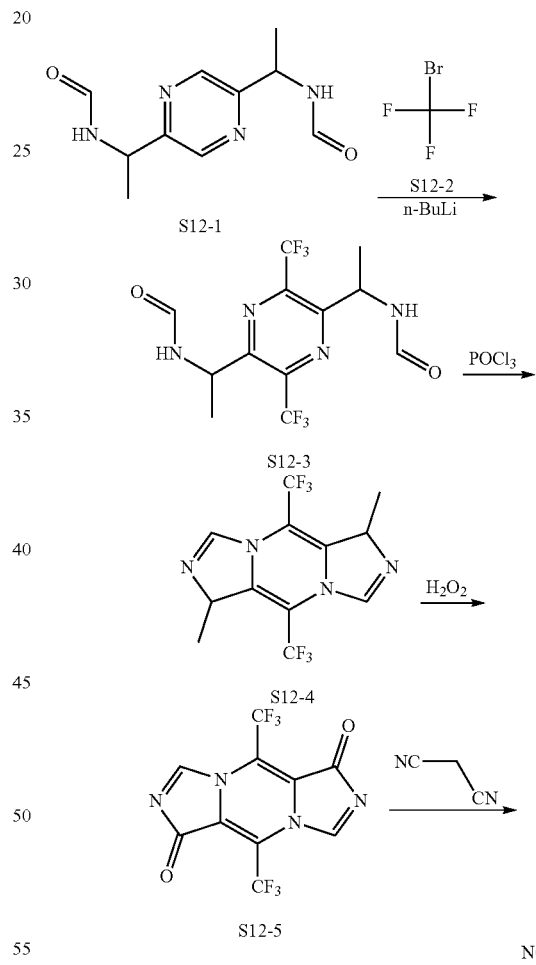

Example 2 differs from Example 1 only in that S4-1 in step (1) was replaced with S7-1 in an equimolar amount and S4-2 in step (1) was replaced with S7-2 in an equimolar amount, and other raw materials, amounts and process parameters were the same as those in Example 1 so that the target product P7 was obtained.

Structural characterization of Organic Compound P7: $C_{40}H_{18}F_4N_6$; mass spectrometry (MS) (M+H)$^+$: calculated value: 659.60; measured value: 659.71.

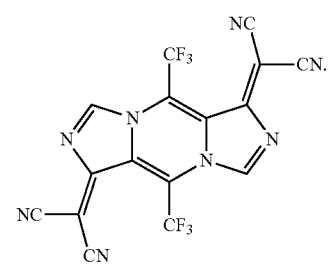

Example 3 differs from Example 1 only in that S4-1 in step (1) was replaced with S12-1 in an equimolar amount and S4-2 in step (1) was replaced with S12-2 in an equimolar amount, and other raw materials, amounts and process parameters were the same as those in Example 1 so that the target product P12 was obtained.

Structural characterization of Organic Compound P12: $C_{16}H_2F_6N_8$; mass spectrometry (MS) (M+H)$^+$: calculated value: 421.23; measured value: 421.16.

Example 4

Organic Compound P28 has a structure of

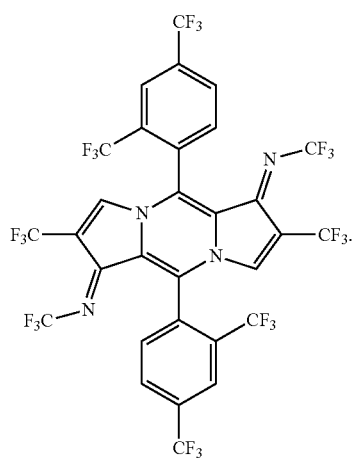

A method for preparing Organic Compound P28 is described below:

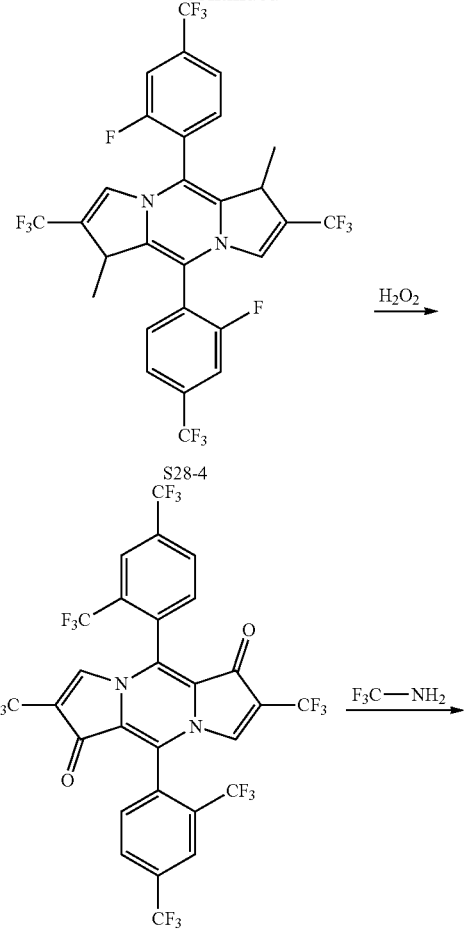

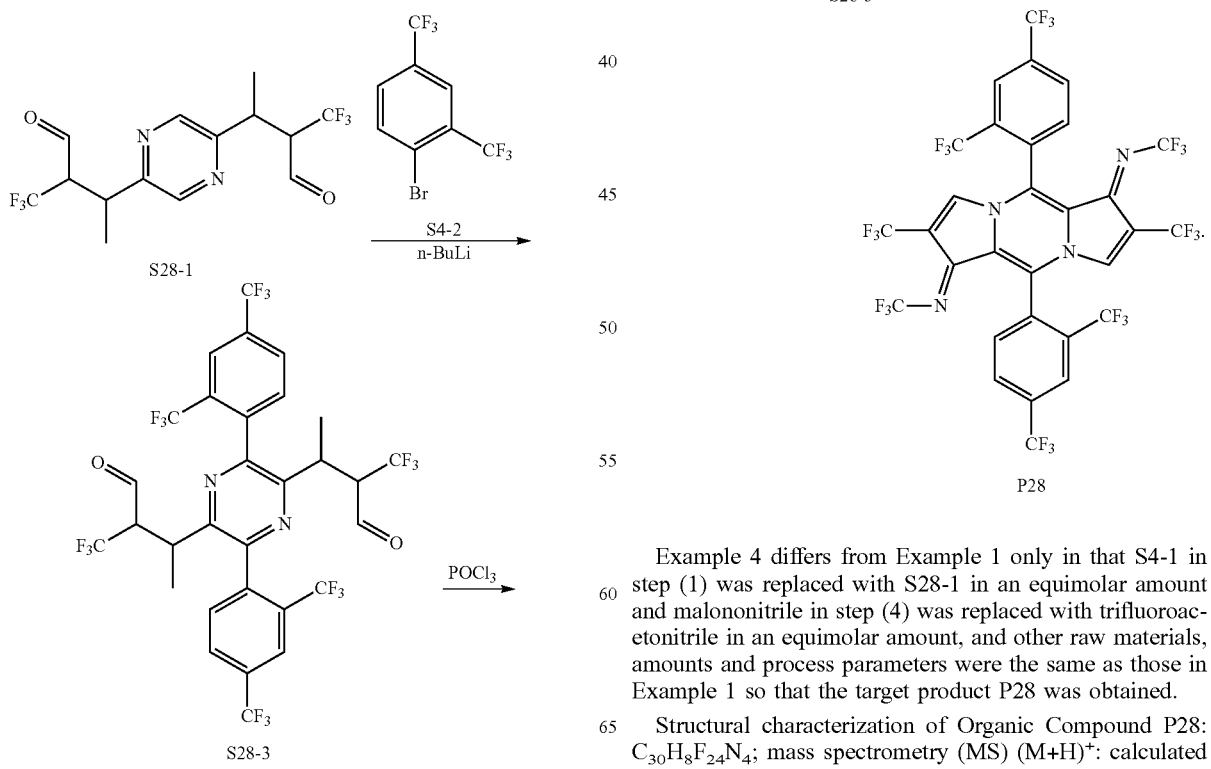

Example 4 differs from Example 1 only in that S4-1 in step (1) was replaced with S28-1 in an equimolar amount and malononitrile in step (4) was replaced with trifluoroacetonitrile in an equimolar amount, and other raw materials, amounts and process parameters were the same as those in Example 1 so that the target product P28 was obtained.

Structural characterization of Organic Compound P28: $C_{30}H_8F_{24}N_4$; mass spectrometry (MS) (M+H)$^+$: calculated value: 881.37; measured value: 881.35.

Example 5

Organic Compound P33 has a structure of

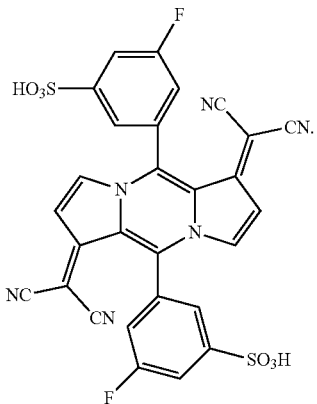

P33

A method for preparing Organic Compound P33 is described below:

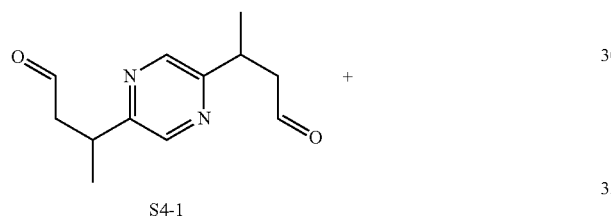

S4-1

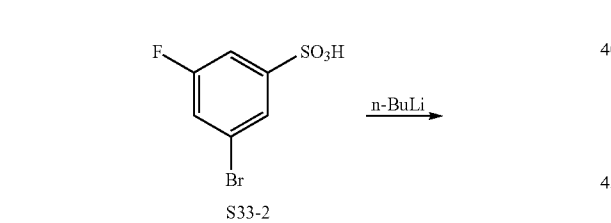

S33-2

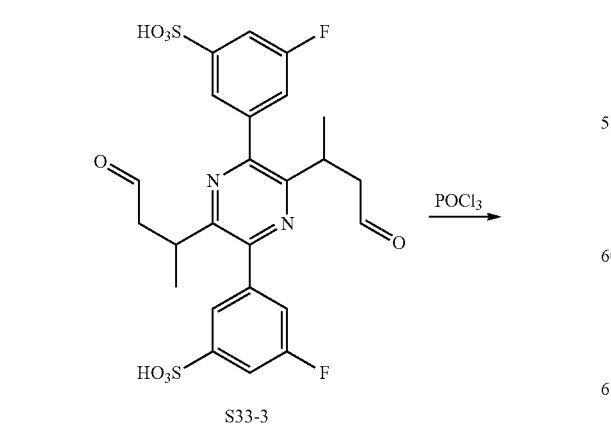

S33-3

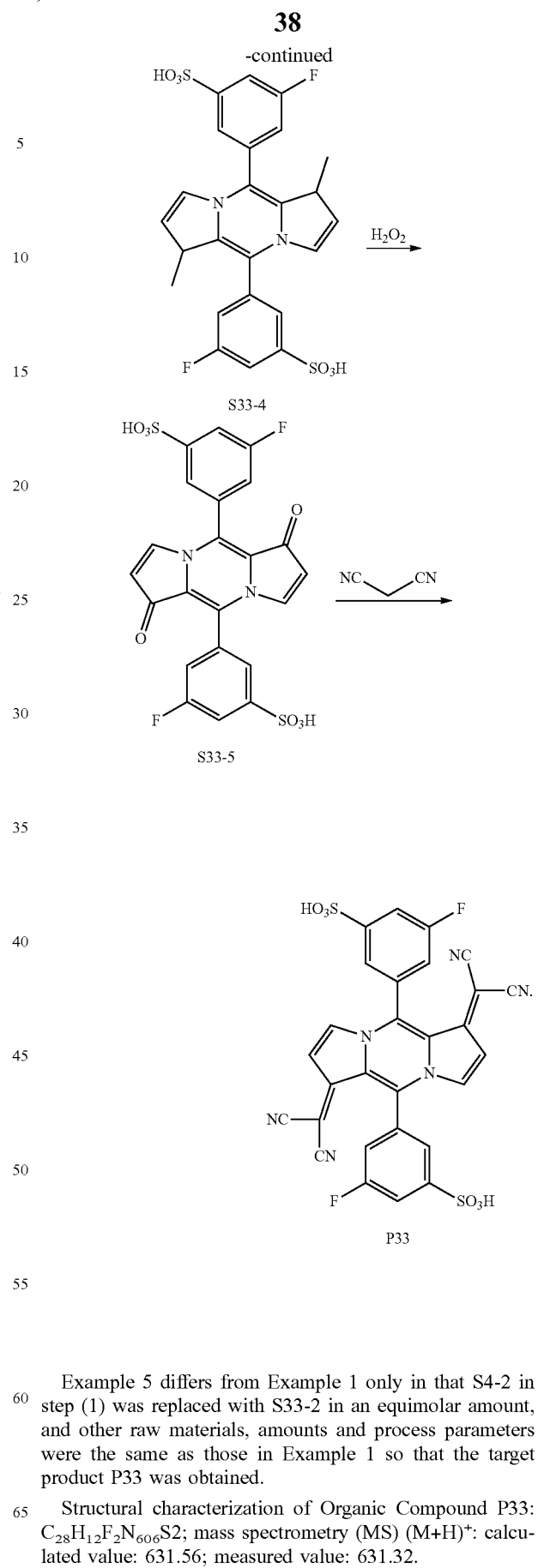

Example 5 differs from Example 1 only in that S4-2 in step (1) was replaced with S33-2 in an equimolar amount, and other raw materials, amounts and process parameters were the same as those in Example 1 so that the target product P33 was obtained.

Structural characterization of Organic Compound P33: $C_{28}H_{12}F_2N_6O_6S2$; mass spectrometry (MS) (M+H)$^+$: calculated value: 631.56; measured value: 631.32.

Example 6

Organic Compound P36 has a structure of

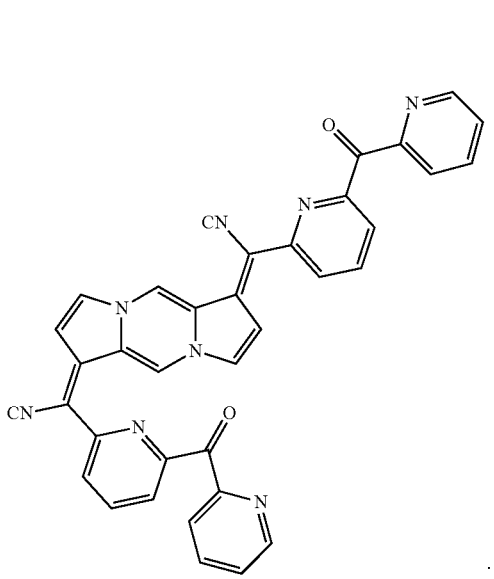

A method for preparing Organic Compound P36 is described below:

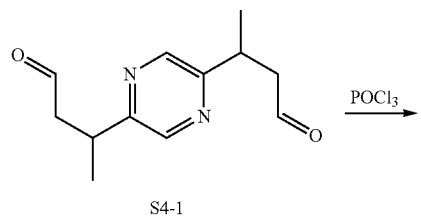

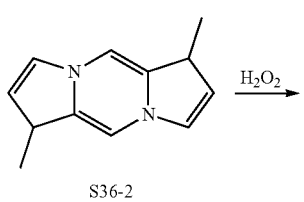

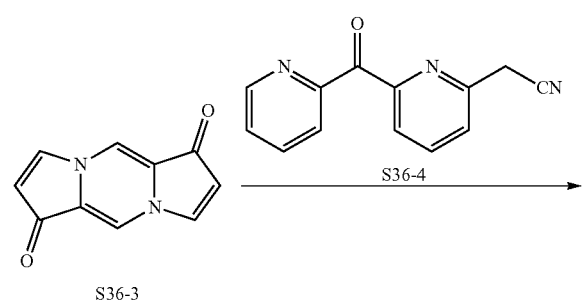

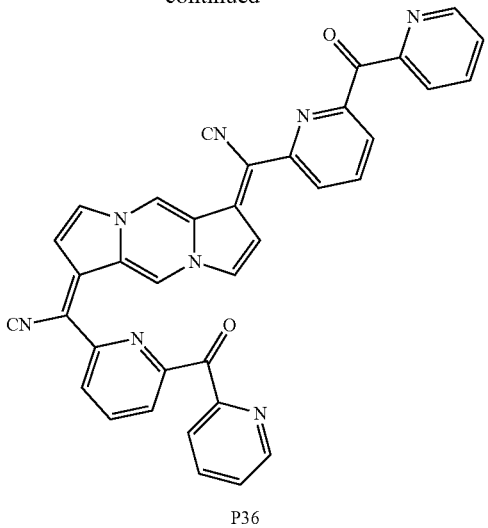

Example 6 differs from Example 1 only in that without step (1), the raw material S4-1 was sequentially subjected to the reactions in steps (2) and (3), the ring was directly closed, malononitrile in step (4) was replaced with S36-4 in an equimolar amount, and other raw materials, amounts and process parameters were the same as those in Example 1 so that the target product P36 was obtained.

Structural characterization of Organic Compound P36: $C_{36}H_{20}N_8O_2$; mass spectrometry (MS) $(M+H)^+$: calculated value: 597.60; measured value: 597.50.

Simulated Calculations of Compounds

By use of a density-functional theory (DFT), for the organic compounds provided by the present disclosure, the distribution of frontier molecular orbitals (HOMO and LUMO) was optimized and calculated by using a Gaussian 09 package (Gaussian Inc.) at a calculation level of B3LYP/6-31G(d). For example, the results are shown in Table 1.

TABLE 1

| Organic Compound | HOMO (eV) | LUMO (eV) | $E_g$ (eV) |
| --- | --- | --- | --- |
| P4 | −7.52 | −5.19 | 2.35 |
| P7 | −7.83 | −5.64 | 2.3 |
| P12 | −7.62 | −5.19 | 2.42 |
| P28 | −7.77 | −5.34 | 2.43 |
| P33 | −7.92 | −5.50 | 2.42 |
| P36 | −8.03 | −5.48 | 2.55 |

As can be seen from the data in Table 1, through a design of a molecular structure, the organic compounds provided by the present disclosure each have a relatively deep LUMO energy level of −5.19 eV to −5.64 eV, which is close to a HOMO energy level of a hole transport material. The organic compounds can be used as a P-type doped material to improve a hole injection capability of an organic electroluminescent device.

Several application examples of the organic light-emitting display panels and organic electroluminescent devices provided by the present disclosure are listed below.

Application Example 1

An organic electroluminescent device includes the following structures which are disposed in sequence: a glass substrate with an ITO anode, a hole injection layer, a hole transport layer, a light-emitting layer, an electron transport layer and a cathode (aluminum electrode).

The organic electroluminescent device is prepared through steps described below.

(1) A glass substrate with an ITO anode was cleaned and installed onto a vacuum deposition device, and organic layers were formed in sequence through thermal deposition.

(2) Hole injection layer: Compound HT (matrix material) and Organic Compound P4 (P-type doped material) provided by the present disclosure were co-deposited on the ITO electrode at a mass ratio of 97:3 to form a hole injection layer with a thickness of 10 nm.

(3) Hole transport layer: Compound HT was evaporated on the hole injection layer to form a hole transport layer with a thickness of 120 nm.

(4) Light-emitting layer: Compounds H and D were co-deposited on the hole transport layer at a mass ratio of 98:2 to form a light-emitting layer with a thickness of 20 nm.

(5) Electron transport layer: Compounds ET and Liq were co-deposited on the light-emitting layer at a mass ratio of 50:50 to form an electron transport layer with a thickness of 30 nm.

(6) Cathode: aluminum was evaporated on the electron transport layer as a cathode with a thickness of 120 nm so that the organic electroluminescent device was obtained.

The compounds used in the organic electroluminescent device have the following structures:

Compound HT

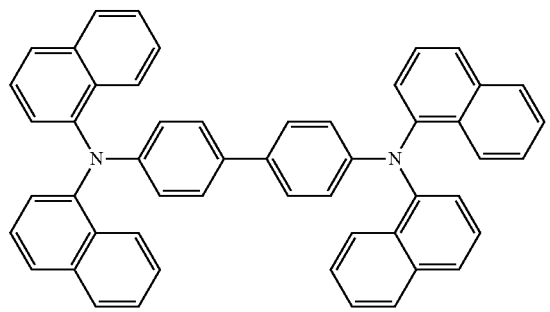

Compound H

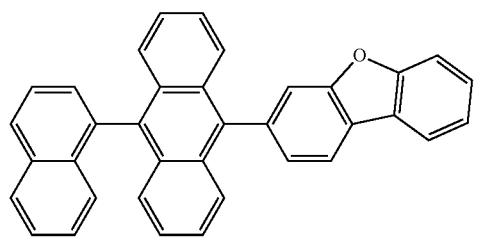

Compound D

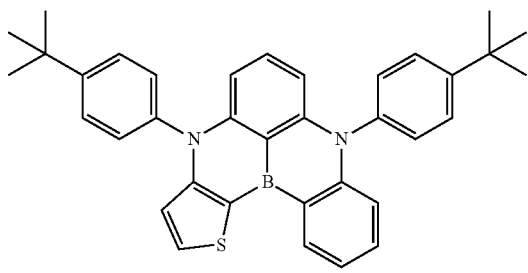

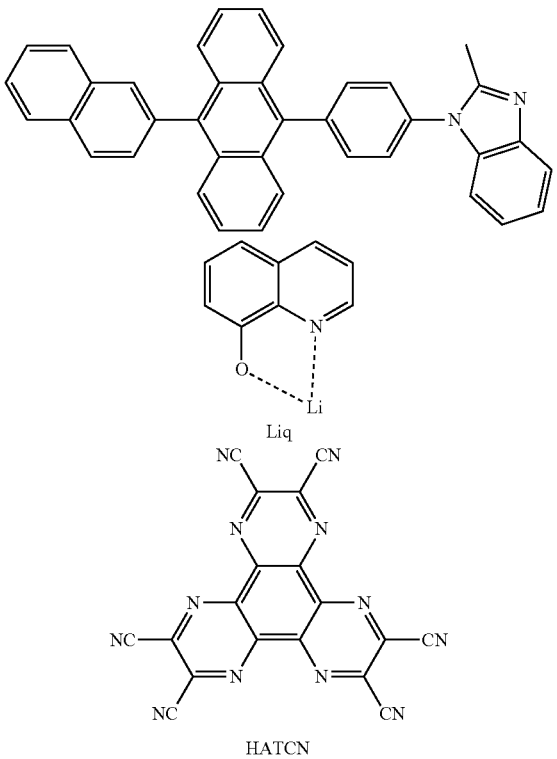

Compound ET / Liq / HATCN

Application Examples 2 to 9

An organic electroluminescent device in each of Application Examples 2 to 9 differs from that in Application Example 1 only in that Organic Compound P4 in step (2) was replaced with Organic Compounds P7, P9, P12, P13, P21, P28, P33 and P36 in an equivalent amount, respectively, and structures, thicknesses, other materials and preparation methods of the device were the same as those in Application Example 1.

Comparative Example 1

An organic electroluminescent device in Comparative Example 1 differs from that in Application Example 1 only in that Organic Compound P4 in step (4) was replaced with Comparative Compound HATCN in an equivalent amount, and structures, thicknesses, other materials and preparation methods of the device were the same as those in Application Example 1.

Performance Evaluation of Devices

The above organic electroluminescent devices were characterized using a standard method. Current efficiency (cd/A), drive voltages (V) and lifetimes (%) were measured using a calibrated Keithley 2400 and CS-2000, where the drive voltages, the current efficiency and the lifetimes were measured values at a current density of $J=10$ mA/cm$^2$, and each of the lifetimes was defined as time required for brightness to decay to 95% of an initial value. The specific data are shown in Table 2.

TABLE 2

| OLED Device | P-type Doped Material of Hole Injection Layer | Drive Voltage (V) | Current Efficiency (cd/A) | Lifetime LT95 (h) |
|---|---|---|---|---|
| Application Example 1 | P4 | 3.46 | 4.5 | 832 |
| Application Example 2 | P7 | 3.68 | 4.8 | 763 |
| Application Example 3 | P9 | 3.67 | 5.7 | 765 |
| Application Example 4 | P12 | 3.97 | 5.0 | 1290 |
| Application Example 5 | P13 | 3.12 | 5.1 | 705 |
| Application Example 6 | P21 | 3.89 | 6.2 | 875 |
| Application Example 7 | P28 | 3.33 | 4.3 | 1100 |
| Application Example 8 | P33 | 3.2 | 4.8 | 1200 |
| Application Example 9 | P36 | 3.45 | 5.2 | 890 |
| Comparative Example 1 | HATCN | 5.42 | 4.2 | 525 |

As can be seen from the test data in Table 2, compared with the representative material HATCN in the art, the organic compounds provided by the present disclosure are used for the hole injection layers as the P-type doped materials such that the organic electroluminescent devices each have a lower drive voltage, a longer lifetime and an improvement in efficiency. These results indicate that when the organic compound of the present disclosure is used as a hole P-type doped material, the energy level of the organic compound is more matched with that of an adjacent hole transport layer and that of the anode so that the organic compound is more conducive to adjusting charge balance of the device and has excellent stability, and thus the organic electroluminescent device containing the organic compound has better performance and is particularly outstanding in terms of voltage reduction and lifetime improvement.

The applicant states that although the organic compound, the P-type doped material and the application thereof of the present disclosure are described through the preceding examples, the present disclosure is not limited to the preceding process steps, which means that the implementation of the present disclosure does not necessarily depend on the preceding process steps. Those skilled in the art are to understand that any improvements made to the present disclosure, equivalent substitutions of selected raw materials, additions of adjuvant ingredients, selections of specific manners or the like in the present disclosure all fall within the protection scope and the disclosure scope of the present disclosure.

What is claimed is:

1. An organic compound having a structure represented by Formula I:

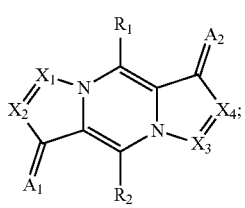

Formula I wherein $X_1$, $X_2$, $X_3$ and $X_4$ are each independently selected from N or CR;

R, $R_1$ and $R_2$ are each independently selected from any one of hydrogen, halogen, cyano, isocyano, substituted or unsubstituted C1-C20 linear or branched alkyl, substituted or unsubstituted C1-C20 alkoxy, substituted or unsubstituted C3-C20 cycloalkyl, substituted or unsubstituted C6-C30 aryl, substituted or unsubstituted C2-C30 heteroaryl, C6-C30 ketoaryl, C4-C30 ketoheteroaryl, C6-C30 aryl sulfonyl, C6-C30 aryl phosphoroso, C3-C20 alkylsilyl, C6-C30 arylsilyl, a phosphino group, an acyl group, a carboxyl group, an ester group, a sulfonyl group or a sulfinyl group;

$A_1$ and $A_2$ are each independently selected from O, NR' or CR"R''';

R', R" and R''' are electron withdrawing groups and each independently selected from any one of halogen, cyano, isocyano, $R_{11}$-substituted C1-C20 linear or branched alkyl, $R_{11}$-substituted C1-C20 alkoxy, $R_{12}$-substituted C6-C30 aryl, substituted or unsubstituted C3-C30 heteroaryl, substituted or unsubstituted C6-C30 ketoaryl, substituted or unsubstituted C4-C30 ketoheteroaryl, substituted or unsubstituted C6-C30 aryl sulfonyl, substituted or unsubstituted C6-C30 aryl phosphoroso, an ester group, an acyl group, a carboxyl group, a phosphino group, a sulfo group, a sulfonyl group or a sulfinyl group;

$R_{11}$ is each independently selected from at least one of halogen, cyano, isocyano or a sulfo group; and $R_{12}$ is each independently selected from at least one of halogen, cyano, isocyano, a sulfo group, halogenated C1-C20 linear or branched alkyl or halogenated C1-C20 alkoxy.

2. The organic compound according to claim 1, wherein the substituted substituents in R, $R_1$ and $R_2$ are each independently selected from at least one of halogen, cyano, isocyano, a sulfo group, methylsilyl, unsubstituted or halogenated C1-C10 linear or branched alkyl, unsubstituted or halogenated C1-C10 alkoxy, unsubstituted or halogenated C1-C10 alkylthio, unsubstituted or $R_{21}$-substituted C6-C18 aryl, or unsubstituted or $R_{21}$-substituted C3-C18 heteroaryl;

substituents in substituted heteroaryl, substituted ketoaryl, substituted ketoheteroaryl, substituted aryl sulfonyl and substituted aryl phosphoroso in R', R" and R''' are each independently selected from at least one of halogen, cyano, isocyano, a sulfo group, unsubstituted or halogenated C1-C10 straight or branched chain alkyl, unsubstituted or halogenated C1-C10 alkoxy, unsubstituted or halogenated C1-C10 alkylthio, unsubstituted or $R_{21}$-substituted C6-C18 aryl, or unsubstituted or $R_{21}$-substituted C3-C18 heteroaryl; and $R_{21}$ is each independently selected from at least one of halogen, cyano, isocyano, a sulfo group, halogenated C1-C10 linear or branched alkyl, or halogenated C1-C10 alkoxy.

3. The organic compound according to claim 1, wherein a number of N in $X_1$, $X_2$, $X_3$ and $X_4$ is 0 to 2.

4. The organic compound according to claim 1, wherein the organic compound has a structure represented by any one of Formula IA, Formula IB or Formula IC:

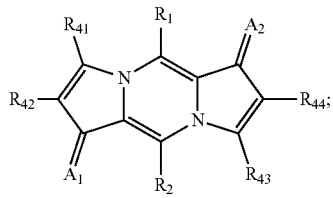

Formula IA

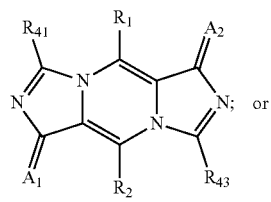

Formula IB

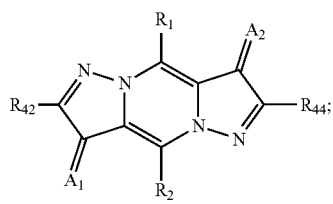

Formula IC wherein $R_1$, $R_2$, $A_1$ and $A_2$ have a same limited range as that in Formula I; and $R_{41}$, $R_{42}$, $R_{43}$ and $R_{44}$ have a same limited range as R.

5. The organic compound according to claim 1, wherein R, $R_1$ and $R_2$ are each independently selected from any one of hydrogen, halogen, cyano, isocyano, unsubstituted or halogenated C1-C10 linear or branched alkyl, unsubstituted or halogenated C1-C10 alkoxy, substituted or unsubstituted C6-C20 aryl, or substituted or unsubstituted C2-C20 heteroaryl;

the substituted substituents are each independently selected from at least one of halogen, cyano, isocyano, a sulfo group, methylsilyl, unsubstituted or halogenated C1-C10 linear or branched alkyl, unsubstituted or halogenated C1-C10 alkoxy, unsubstituted or halogenated C1-C10 alkylthio, unsubstituted or $R_{21}$-substituted C6-C12 aryl, or unsubstituted or $R_{21}$-substituted C3-C12 heteroaryl; and $R_{21}$ is each independently selected from at least one of halogen, cyano, isocyano, a sulfo group, halogenated C1-C6 linear or branched alkyl or halogenated C1-C6 alkoxy.

6. The organic compound according to claim 1, wherein R, $R_1$ and $R_2$ are each independently selected from any one of hydrogen, halogen, cyano, isocyano, unsubstituted or fluorinated C1-C6 linear or branched alkyl, unsubstituted or fluorinated C1-C6 alkoxy, substituted or unsubstituted phenyl, substituted or unsubstituted biphenyl, substituted or unsubstituted naphthyl, or substituted or unsubstituted C2-C8 nitrogen-containing heteroaryl; and the substituted substituents are each independently selected from at least one of fluorine, cyano, isocyano, a sulfo group, methylsilyl, unsubstituted or fluorinated C1-C6 linear or branched alkyl, unsubstituted or fluorinated C1-C6 alkoxy, or unsubstituted or fluorinated C1-C6 alkylthio.

7. The organic compound according to claim 4, wherein $R_{41}$, $R_{42}$, $R_{43}$ and $R_{44}$ are each independently selected from any one of hydrogen, halogen, cyano, isocyano, a sulfo group, unsubstituted or halogenated C1-C10 linear or branched alkyl, unsubstituted or halogenated C1-C10 alkoxy, substituted or unsubstituted C6-C20 aryl, or substituted or unsubstituted C2-C20 heteroaryl;

the substituted substituents are each independently selected from at least one of halogen, cyano, isocyano, a sulfo group, unsubstituted or halogenated C1-C10 linear or branched alkyl, unsubstituted or halogenated C1-C10 alkoxy, unsubstituted or halogenated C1-C10 alkylthio, unsubstituted or $R_{21}$-substituted C6-C12 aryl, or unsubstituted or $R_{21}$-substituted C3-C12 heteroaryl; and $R_{21}$ is each independently selected from at least one of halogen, cyano, isocyano, a sulfo group, halogenated C1-C6 linear or branched alkyl, or halogenated C1-C6 alkoxy.

8. The organic compound according to claim 4, wherein $R_{41}$, $R_{42}$, $R_{43}$ and $R_{44}$ are each independently selected from any one of hydrogen, fluorine, cyano, isocyano, a sulfo group, unsubstituted or fluorinated C1-C6 linear or branched alkyl, unsubstituted or fluorinated C1-C6 alkoxy, substituted or unsubstituted phenyl, substituted or unsubstituted biphenyl, substituted or unsubstituted naphthyl, or substituted or unsubstituted C2-C8 nitrogen-containing heteroaryl; and the substituted substituents are each independently selected from at least one of fluorine, cyano, isocyano, a sulfo group, unsubstituted or fluorinated C1-C6 linear or branched alkyl, unsubstituted or fluorinated C1-C6 alkoxy, or unsubstituted or fluorinated C1-C6 alkylthio.

9. The organic compound according to claim 1, wherein R', R" and R'" are each independently selected from any one of halogen, cyano, isocyano, a sulfo group, halogenated C1-C10 linear or branched alkyl, halogenated C1-C10 alkoxy,

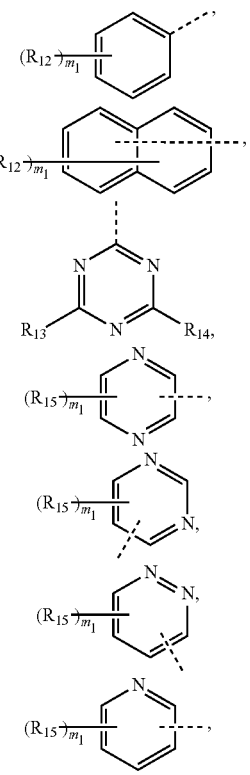

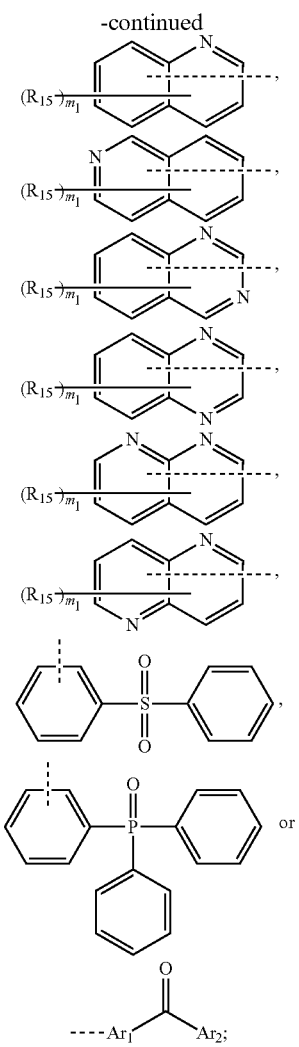

wherein the dashed line represents a linkage site of the group;

R$_{12}$ is selected from any one of halogen, cyano, isocyano, a sulfo group, halogenated C1-C10 linear or branched alkyl, or halogenated C1-C10 alkoxy;

R$_{13}$ and R$_{14}$ are each independently selected from any one of hydrogen, halogen, cyano, isocyano, a sulfo group, unsubstituted or halogenated C1-C10 linear or branched alkyl, unsubstituted or halogenated C1-C10 alkoxy, unsubstituted or halogenated C1-C10 alkylthio, unsubstituted or R$_{21}$-substituted C6-C18 aryl, or unsubstituted or R$_{21}$-substituted C3-C18 heteroaryl;

Ar$_1$ is selected from any one of unsubstituted or R$_{15}$-substituted phenylene, unsubstituted or R$_{15}$-substituted naphthylene, or unsubstituted or R$_{15}$-substituted C3-C9 nitrogen-containing heteroarylene;

Ar$_2$ is selected from any one of unsubstituted or R$_{15}$-substituted phenyl, unsubstituted or R$_{15}$-substituted naphthyl, or unsubstituted or R$_{15}$-substituted C3-C9 nitrogen-containing heteroaryl;

R$_{15}$ is selected from any one of halogen, cyano, isocyano, a sulfo group, unsubstituted or halogenated C1-C10 linear or branched alkyl, unsubstituted or halogenated C1-C10 alkoxy, unsubstituted or halogenated C1-C10 alkylthio, unsubstituted or R$_{21}$-substituted C6-C18 aryl, or unsubstituted or R$_{21}$-substituted C3-C18 heteroaryl;

R$_{21}$ is each independently selected from at least one of halogen, cyano, isocyano, a sulfo group, halogenated C1-C10 linear or branched alkyl, or halogenated C1-C10 alkoxy; and m$_1$ is selected from an integer from 0 to 3.

10. The organic compound according to claim 1, wherein R', R'' and R''' are each independently selected from any one of fluorine, cyano, isocyano, fluorinated C1-C6 linear or branched alkyl, fluorinated C1-C6 alkoxy, wherein the dashed line represents a linkage site of the group; and R$_{12}$' is selected from any one of fluorine, perfluoromethyl, perfluoromethoxy, cyano or isocyano.

11. The organic compound according to claim 1, wherein A$_1$ and A$_2$ are the same.

12. The organic compound according to claim 1, wherein the organic compound is selected from any one of the following Compounds P1 to P38:

P1
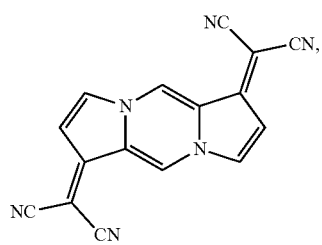

P2
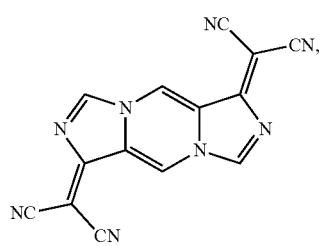

P3
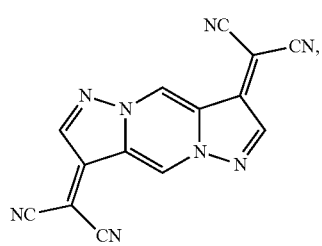

P4
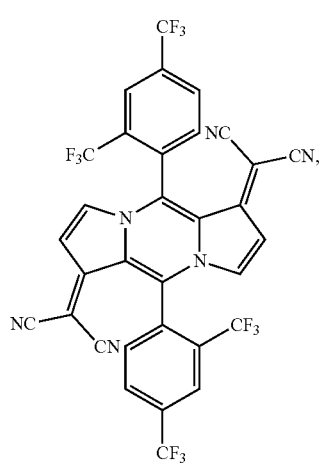

-continued

P5
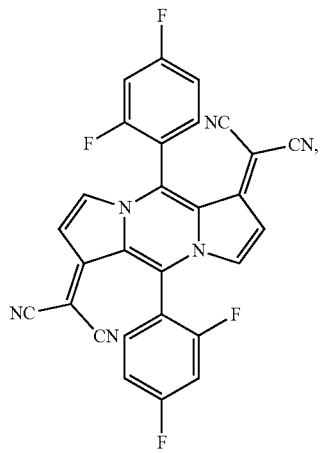

P6
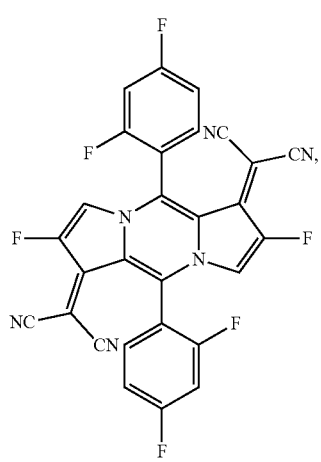

P7
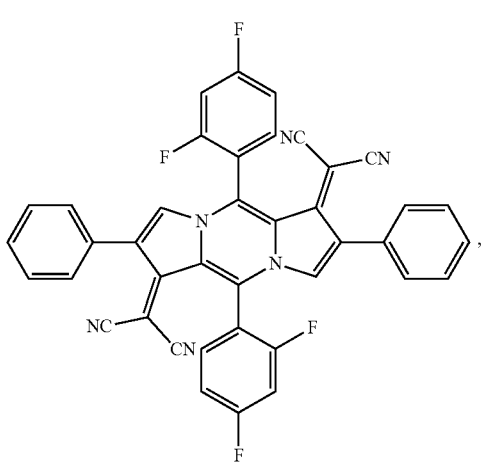

-continued
P8
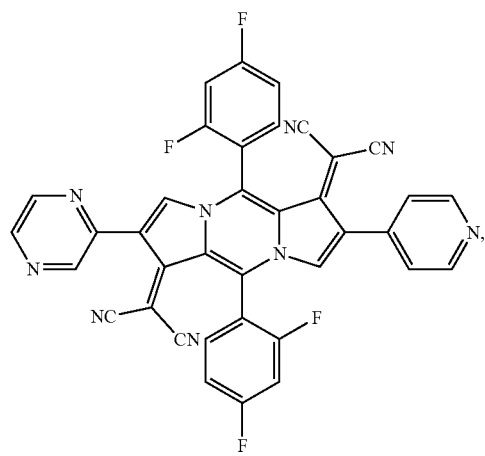
P9
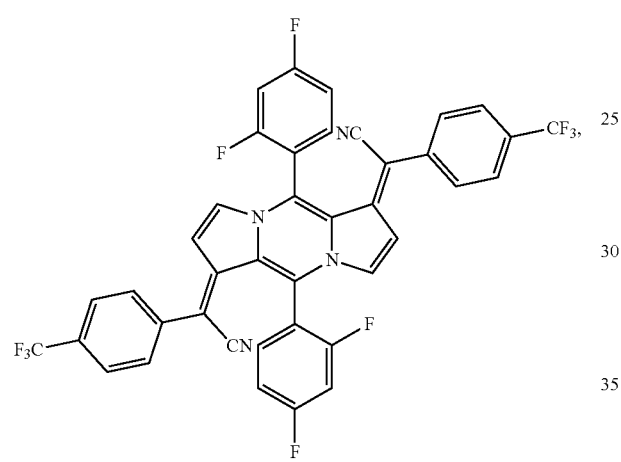
P10
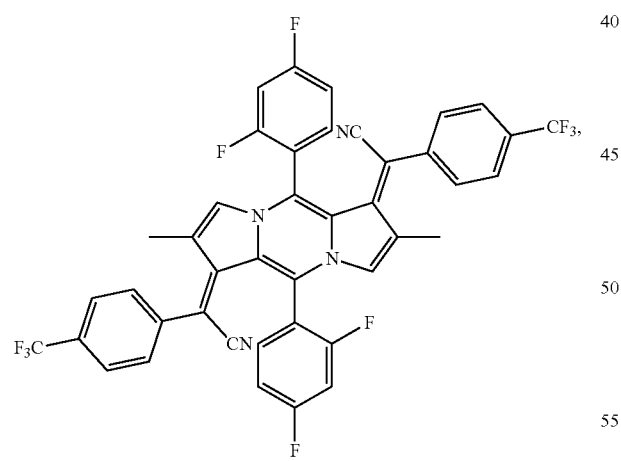
P11
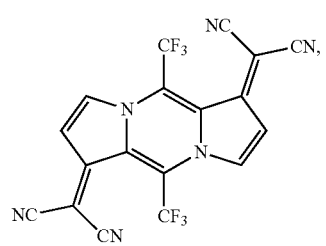
P12
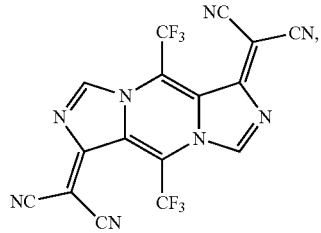
P13
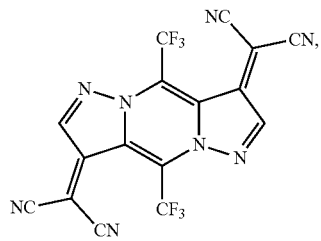
P14
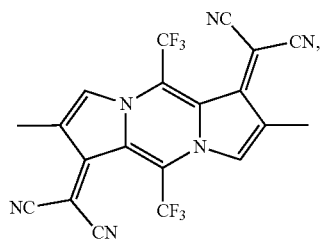
P15
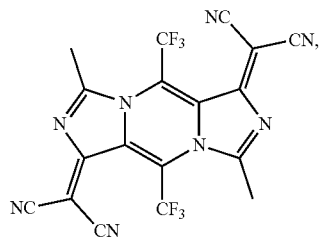
P16
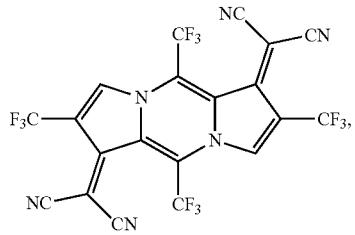
P17
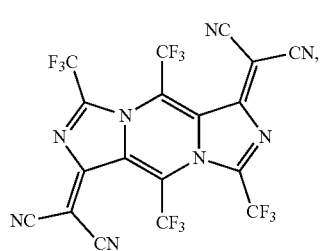

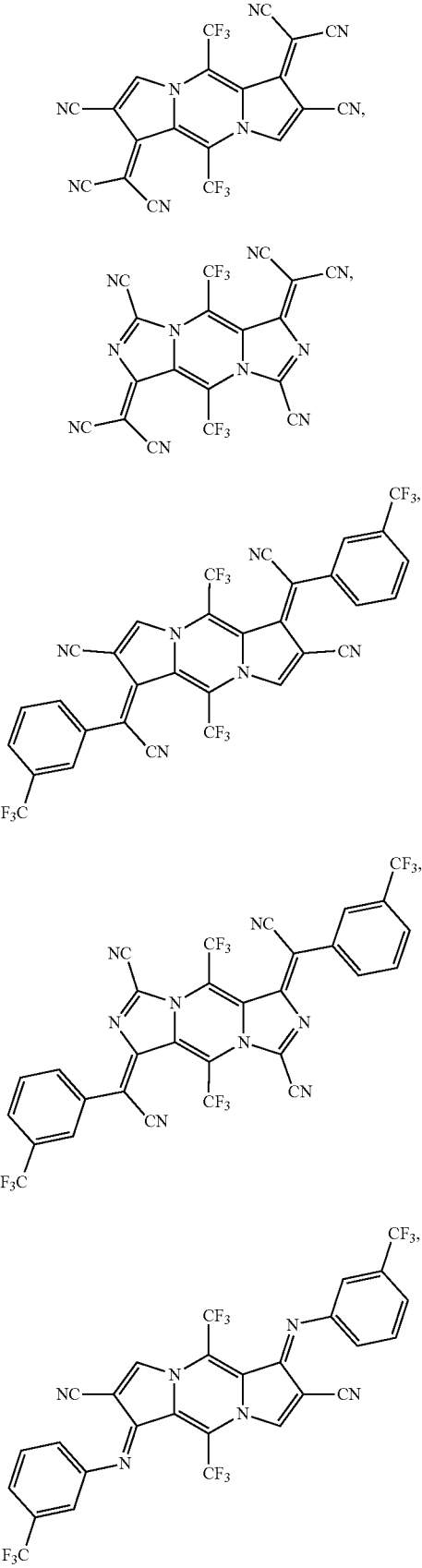
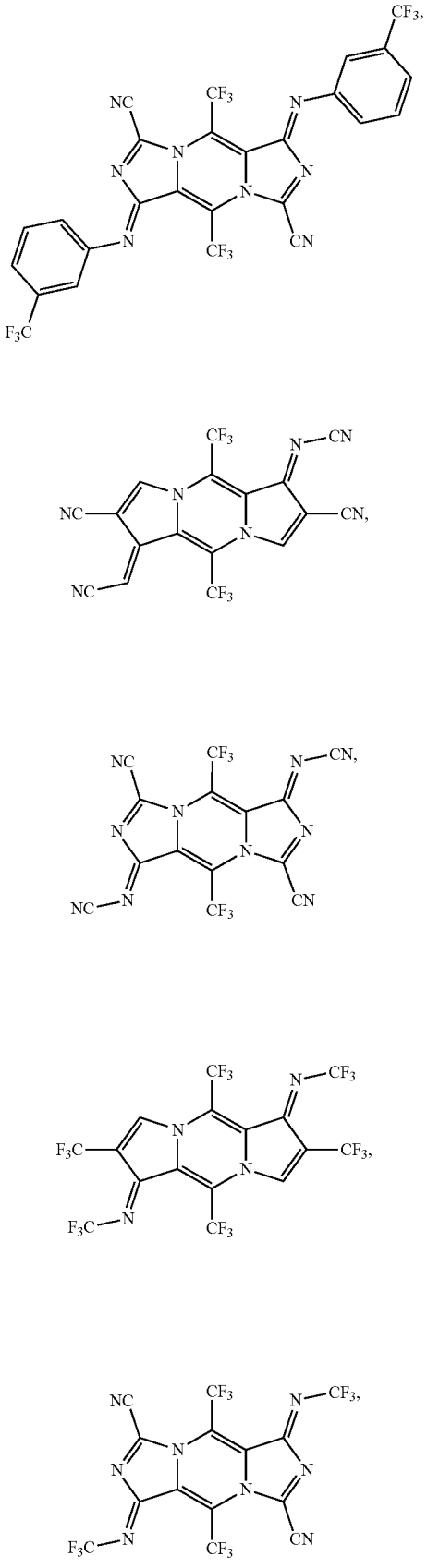

-continued
P28
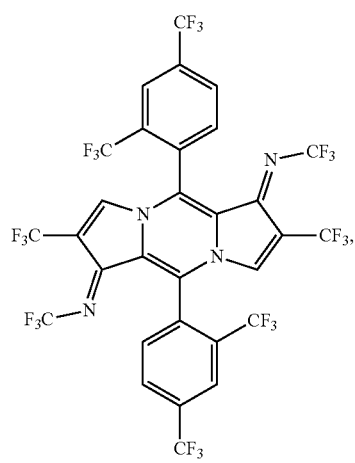
P29
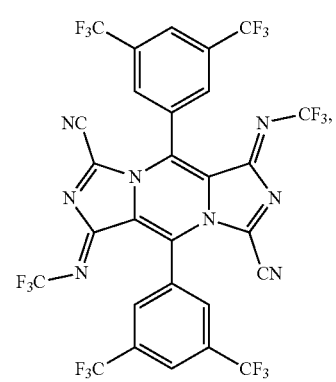
P30
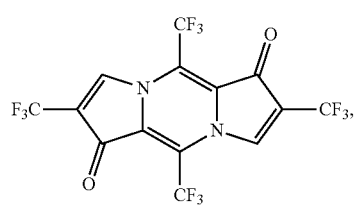
P31
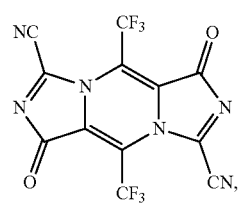
P32
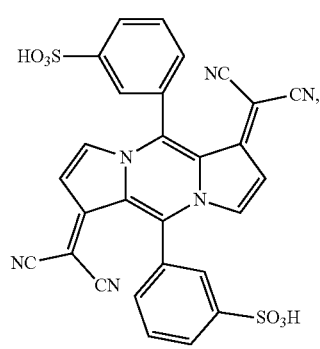
-continued
P33
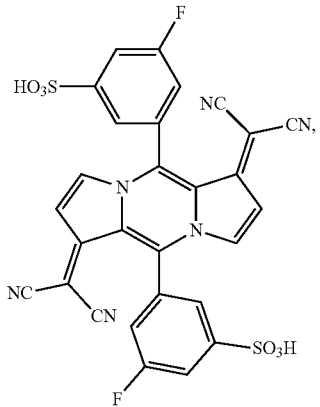
P34
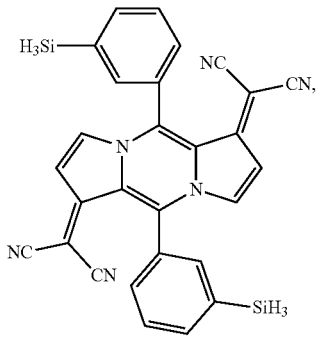
P35
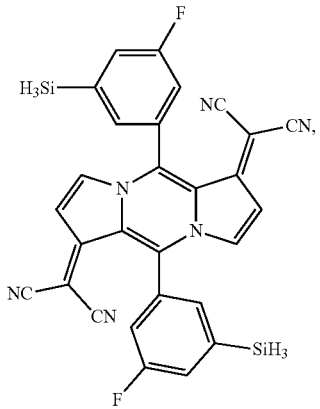
P36
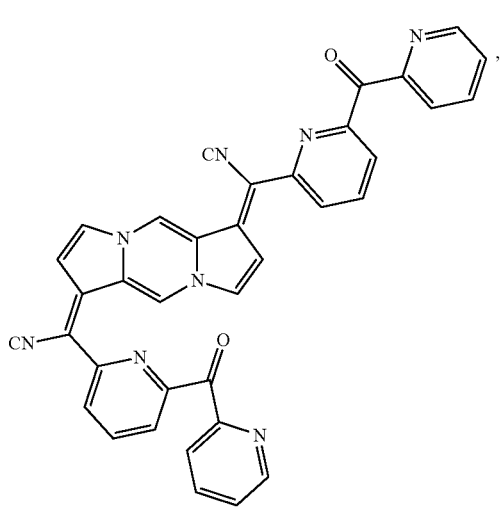

-continued

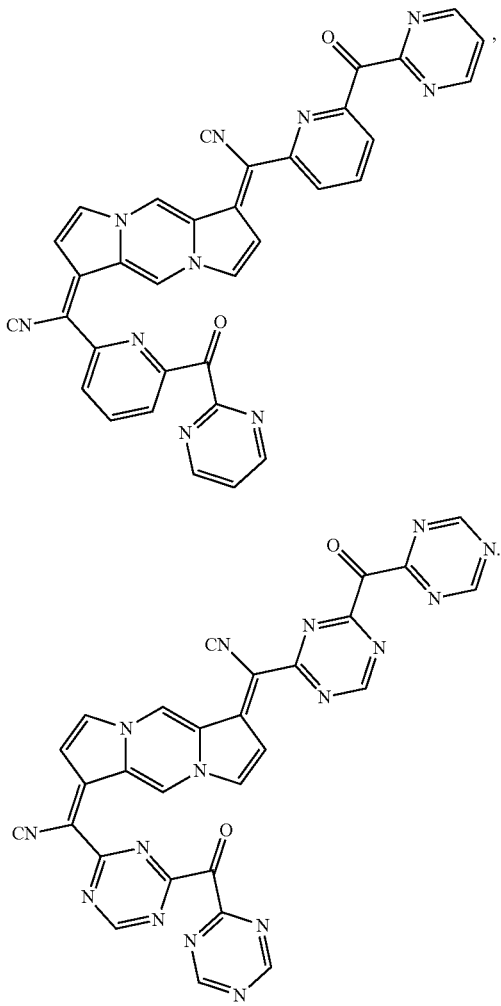

13. A P-type doped material, comprising an organic compound, wherein the organic compound has a structure represented by Formula I:

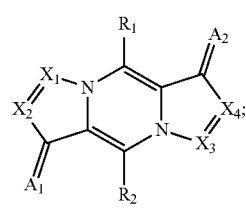

Formula I wherein $X_1$, $X_2$, $X_3$ and $X_4$ are each independently selected from N or CR;

R, $R_1$ and $R_2$ are each independently selected from any one of hydrogen, halogen, cyano, isocyano, substituted or unsubstituted C1-C20 linear or branched alkyl, substituted or unsubstituted C1-C20 alkoxy, substituted or unsubstituted C3-C20 cycloalkyl, substituted or unsubstituted C6-C30 aryl, substituted or unsubstituted C2-C30 heteroaryl, C6-C30 ketoaryl, C4-C30 ketoheteroaryl, C6-C30 aryl sulfonyl, C6-C30 aryl phosphoroso, C3-C20 alkylsilyl, C6-C30 arylsilyl, a phosphino group, an acyl group, a carboxyl group, an ester group, a sulfonyl group or a sulfinyl group;

$A_1$ and $A_2$ are each independently selected from O, NR' or CR"R''';

R', R" and R''' are electron withdrawing groups and each independently selected from any one of halogen, cyano, isocyano, $R_{11}$-substituted C1-C20 linear or branched alkyl, $R_{11}$-substituted C1-C20 alkoxy, $R_{12}$-substituted C6-C30 aryl, substituted or unsubstituted C3-C30 heteroaryl, substituted or unsubstituted C6-C30 ketoaryl, substituted or unsubstituted C4-C30 ketoheteroaryl, substituted or unsubstituted C6-C30 aryl sulfonyl, substituted or unsubstituted C6-C30 aryl phosphoroso, an ester group, an acyl group, a carboxyl group, a phosphino group, a sulfo group, a sulfonyl group or a sulfinyl group;

$R_{11}$ is each independently selected from at least one of halogen, cyano, isocyano or a sulfo group; and $R_{12}$ is each independently selected from at least one of halogen, cyano, isocyano, a sulfo group, halogenated C1-C20 linear or branched alkyl or halogenated C1-C20 alkoxy.

14. An organic light-emitting display panel, comprising an anode, a cathode and an organic layer disposed between the anode and the cathode, wherein a material of the organic layer comprises a P-type doped material, wherein the P-type doped material, comprises an organic compound, and wherein the organic compound has a structure represented by Formula I:

Formula I wherein $X_1$, $X_2$, $X_3$ and $X_4$ are each independently selected from N or CR;

R, $R_1$ and $R_2$ are each independently selected from any one of hydrogen, halogen, cyano, isocyano, substituted or unsubstituted C1-C20 linear or branched alkyl, substituted or unsubstituted C1-C20 alkoxy, substituted or unsubstituted C3-C20 cycloalkyl, substituted or unsubstituted C6-C30 aryl, substituted or unsubstituted C2-C30 heteroaryl, C6-C30 ketoaryl, C4-C30 ketoheteroaryl, C6-C30 aryl sulfonyl, C6-C30 aryl phosphoroso, C3-C20 alkylsilyl, C6-C30 arylsilyl, a phosphino group, an acyl group, a carboxyl group, an ester group, a sulfonyl group or a sulfinyl group;

$A_1$ and $A_2$ are each independently selected from O, NR' or CR"R''';

R', R" and R''' are electron withdrawing groups and each independently selected from any one of halogen, cyano, isocyano, $R_{11}$-substituted C1-C20 linear or branched alkyl, $R_{11}$-substituted C1-C20 alkoxy, $R_{12}$-substituted C6-C30 aryl, substituted or unsubstituted C3-C30 heteroaryl, substituted or unsubstituted C6-C30 ketoaryl, substituted or unsubstituted C4-C30 ketoheteroaryl, substituted or unsubstituted C6-C30 aryl sulfonyl, substituted or unsubstituted C6-C30 aryl phosphoroso, an ester group, an acyl group, a carboxyl group, a phosphino group, a sulfo group, a sulfonyl group or a sulfinyl group;

$R_{11}$ is each independently selected from at least one of halogen, cyano, isocyano or a sulfo group; and $R_{12}$ is each independently selected from at least one of halogen, cyano, isocyano, a sulfo group, halogenated C1-C20 linear or branched alkyl or halogenated C1-C20 alkoxy.

15. The organic light-emitting display panel according to claim 14, wherein the organic layer comprises a hole injection layer, and the hole injection layer comprises the P-type doped material.

16. The organic light-emitting display panel according to claim 15, wherein the hole injection layer further comprises a matrix material, and the matrix material is a hole transport compound.

17. A display device, comprising the organic light-emitting display panel according to claim 14.

* * * * *